United States Patent
Shirakawa et al.

(10) Patent No.: US 9,892,040 B2
(45) Date of Patent: Feb. 13, 2018

(54) SEMICONDUCTOR MEMORY DEVICE

(71) Applicant: KABUSHIKI KAISHA TOSHIBA, Minato-ku, Tokyo (JP)

(72) Inventors: Masanobu Shirakawa, Chigasaki Kanagawa (JP); Takuya Futatsuyama, Yokohama Kanagawa (JP); Kenichi Abe, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 60 days.

(21) Appl. No.: 14/841,459

(22) Filed: Aug. 31, 2015

(65) Prior Publication Data
US 2016/0071601 A1 Mar. 10, 2016

(30) Foreign Application Priority Data

Sep. 4, 2014 (JP) .................................. 2014-180577

(51) Int. Cl.
| G06F 12/08 | (2016.01) |
| G06F 12/0811 | (2016.01) |
| G11C 16/04 | (2006.01) |
| G11C 16/08 | (2006.01) |
| G11C 16/10 | (2006.01) |
| G11C 16/30 | (2006.01) |
| G11C 11/56 | (2006.01) |
| G11C 8/08 | (2006.01) |
| G11C 29/02 | (2006.01) |
| G06F 12/0868 | (2016.01) |
| G11C 16/26 | (2006.01) |

(Continued)

(52) U.S. Cl.
CPC ...... *G06F 12/0811* (2013.01); *G06F 12/0868* (2013.01); *G11C 8/08* (2013.01); *G11C 11/5628* (2013.01); *G11C 16/0483* (2013.01); *G11C 16/08* (2013.01); *G11C 16/10* (2013.01); *G11C 16/30* (2013.01); *G11C 29/021* (2013.01); *G11C 29/028* (2013.01); *G06F 2212/283* (2013.01); *G11C 11/5635* (2013.01); *G11C 11/5642* (2013.01); *G11C 16/16* (2013.01); *G11C 16/26* (2013.01); *G11C 2029/1202* (2013.01)

(58) Field of Classification Search
CPC ... G06F 12/0811; G06F 12/0868; G11C 8/08; G11C 11/5628; G11C 16/08; G11C 16/10; G11C 16/30; G11C 16/0483; G11C 29/021; G11C 29/028
USPC .................................................. 711/122, 120
See application file for complete search history.

(56) References Cited

U.S. PATENT DOCUMENTS 8,032,810 B2 * 10/2011 Ishikawa ............. G11C 11/5628
714/754
8,358,538 B2 * 1/2013 Moschiano ......... G11C 11/5635
365/185.03

(Continued)

Primary Examiner — Pierre-Michel Bataille
(74) Attorney, Agent, or Firm — Holtz Holtz & Volek PC

(57) ABSTRACT

A semiconductor memory device includes: a memory cell array including memory strings, one of the memory strings including memory cells; word lines commonly connected to the memory strings; and a controller configured to execute a write operation and a read operation on a page, the page being stored in memory cells connected to one of the word lines. The controller is configured to measure a cell current flowing in the memory string, and adjust a write voltage applied to a word line, based on a result of the cell current.

16 Claims, 33 Drawing Sheets

(51) Int. Cl.
    *G11C 16/16*    (2006.01)
    *G11C 29/12*    (2006.01)

(56) References Cited

U.S. PATENT DOCUMENTS

| | | | |
|---|---|---|---|
| 9,042,175 B2* | 5/2015 | Sim | G11C 16/26 |
| | | | 365/185.03 |
| 9,343,171 B1* | 5/2016 | Sun | G11C 16/3445 |
| 2007/0206426 A1 | 9/2007 | Mokhlesi | |
| 2008/0084741 A1* | 4/2008 | Shibata | G11C 11/5628 |
| | | | 365/185.03 |
| 2008/0158984 A1 | 7/2008 | Mokhlesi | |
| 2008/0285351 A1 | 11/2008 | Shlick et al. | |
| 2009/0073763 A1 | 3/2009 | Hosono | |
| 2009/0267128 A1 | 10/2009 | Maejima | |
| 2009/0268522 A1 | 10/2009 | Maejima | |
| 2010/0207195 A1 | 8/2010 | Fukuzumi et al. | |
| 2010/0299475 A1* | 11/2010 | Yano | G11C 11/5628 |
| | | | 711/103 |
| 2011/0235420 A1 | 9/2011 | Sharon et al. | |
| 2011/0284946 A1 | 11/2011 | Kiyotoshi | |
| 2013/0080858 A1* | 3/2013 | Lee | G11C 16/26 |
| | | | 714/773 |
| 2014/0003154 A1 | 1/2014 | Abe et al. | |
| 2015/0003162 A1* | 1/2015 | Mui | G11C 11/5635 |
| | | | 365/185.17 |

* cited by examiner

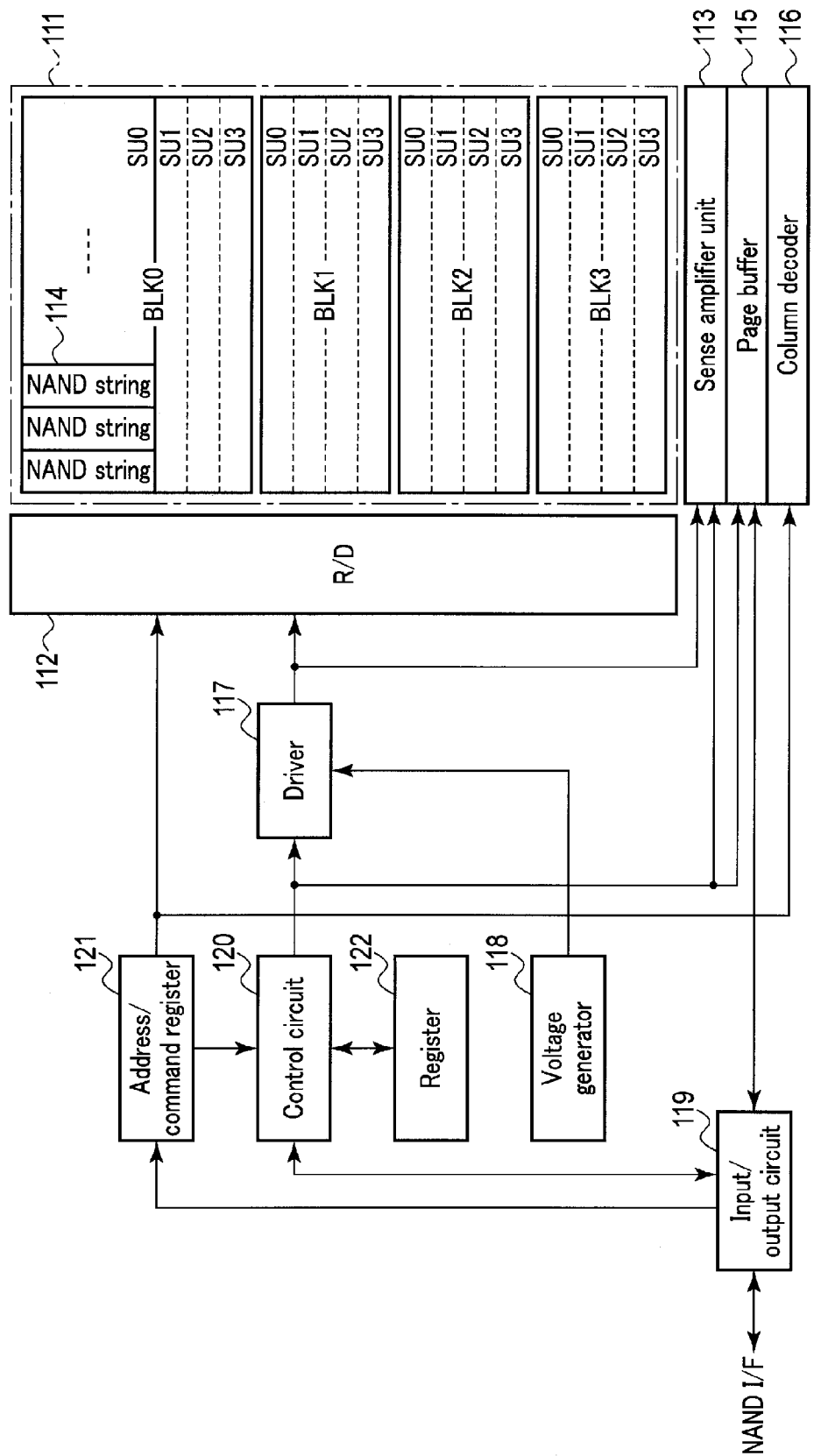
F I G. 2

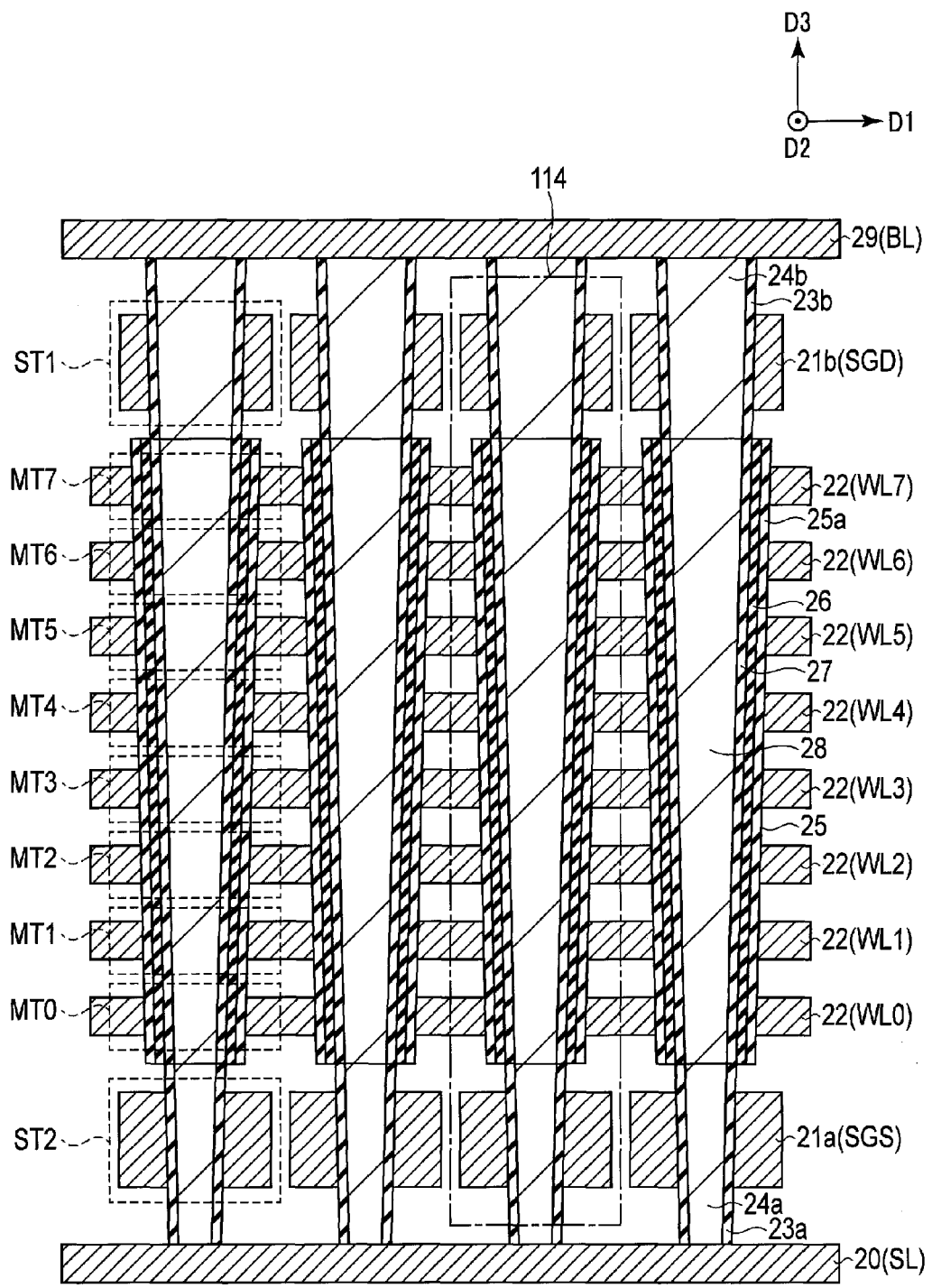
F I G. 4

| VBL_DAC[3:0] | Design target | Program/read parameter set | Erase parameter set |
|---|---|---|---|
| 0000 | | | |
| 0001 | | | |
| 0010 | | | |
| 0011 | | Use of first program parameter set | Use of first erase parameter set |
| 0100 | Fresh design target | | |
| 0101 | | | |
| 0110 | | | |
| 0111 | | | |
| 1000 | | | |
| 1001 | 1K W/E | Use of second program parameter set | Use of second erase parameter set |
| 1010 | | | |
| 1011 | | | |
| 1100 | 2K W/E | Use of third program parameter set | Use of third erase parameter set |
| 1101 | | | |
| 1110 | 3K W/E | Use of fourth program parameter set | Use of fourth erase parameter set |
| 1111 | | | |

FIG. 10

| VBL_DAC[3:0] | Design target | Program/read parameter set | Erase parameter set |
|---|---|---|---|
| 0000 | | Use of first program parameter set | Use of first erase parameter set |
| 0001 | Fresh design target | | |
| 0010 | | | |
| 0011 | | | |
| 0100 | | | |
| 0101 | 1K W/E | Use of second program parameter set | Use of second erase parameter set |
| 0110 | | | |
| 0111 | | | |
| 1000 | 2K W/E | Use of third program parameter set | Use of third erase parameter set |
| 1001 | | | |
| 1010 | | | |
| 1011 | 3K W/E | Use of fourth program parameter set | Use of fourth erase parameter set |
| 1100 | | | |
| 1101 | | | |
| 1110 | | | |
| 1111 | | | |

FIG. 11

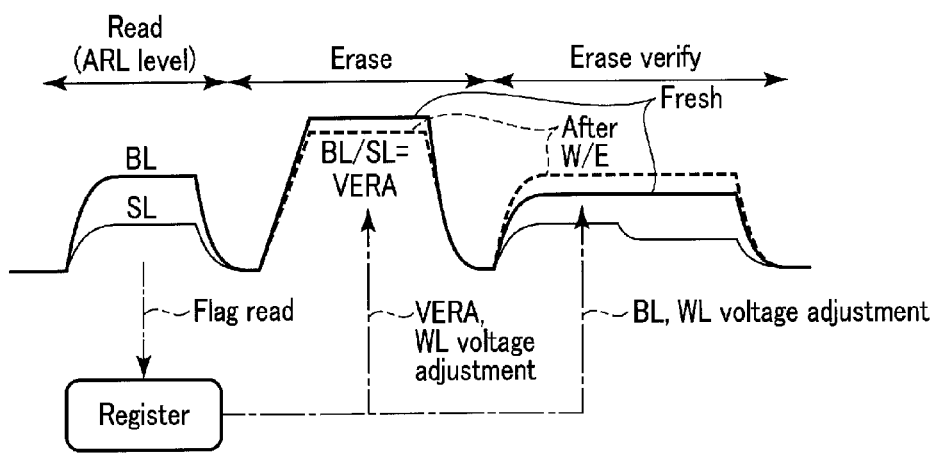

FIG. 12

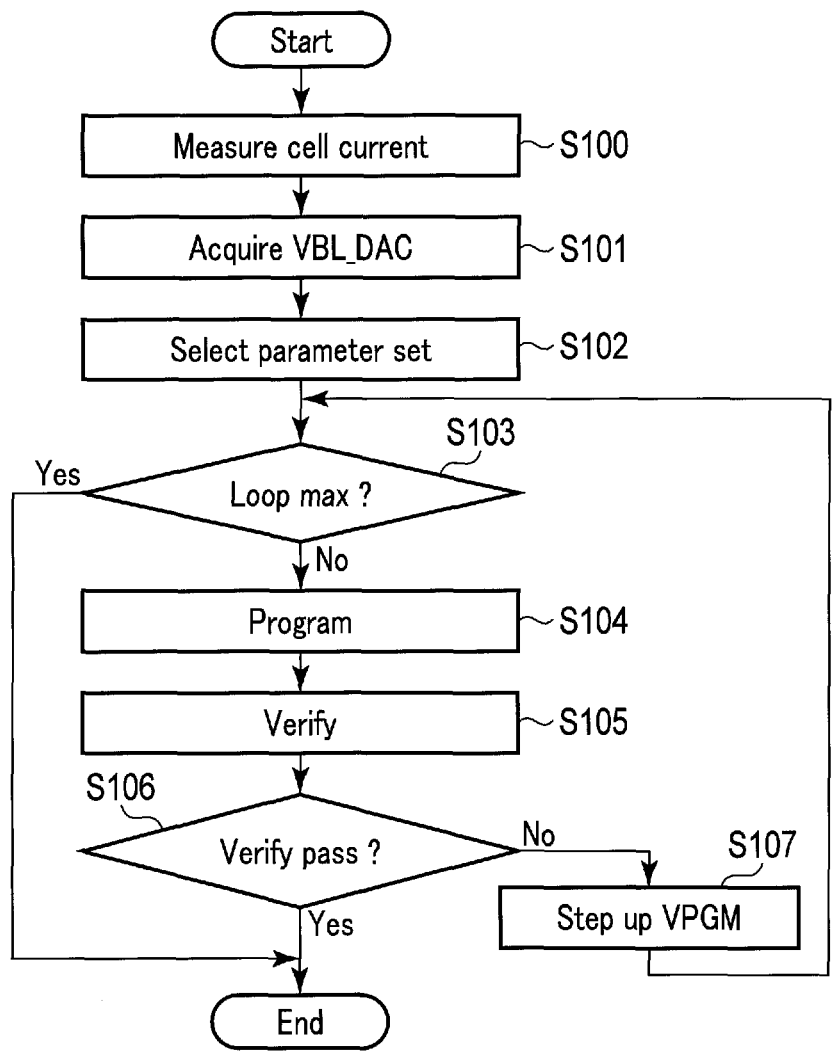
F I G. 13

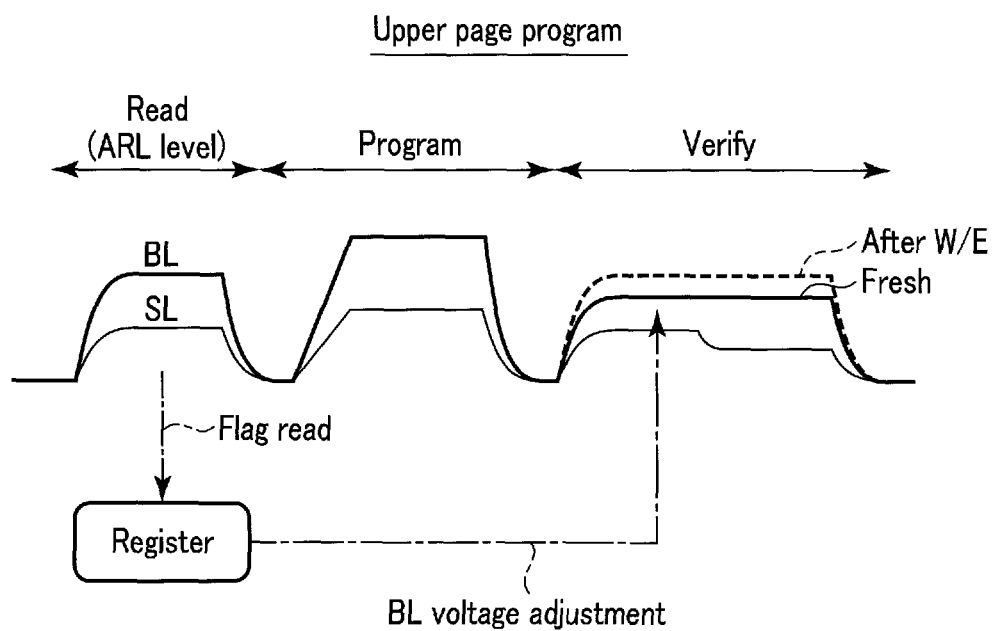
F I G. 18
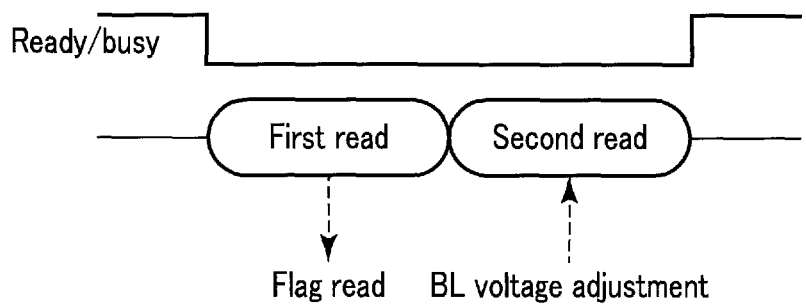
F I G. 19

| VBL_DAC[3:0] | Design target | Erase parameter set (BA) | Erase parameter set (MA) | Erase parameter set (TA) |
|---|---|---|---|---|
| 0000 | | Use of<br>first erase parameter set<br>(VERA=20V, WL=0.2V) | Use of<br>second erase parameter set<br>(VERA=20V, WL=0.1V) | Use of<br>third erase parameter set<br>(VERA=20V, WL=0.05V) |
| 0001 | | | | |
| 0010 | | | | |
| 0011 | | | | |
| 0100 | Fresh design target | | | |
| 0101 | | | | |
| 0110 | | | | |
| 0111 | | | | |
| 1000 | 1K W/E | Use of<br>fourth erase parameter set<br>(VERA=20.5V, WL=0.15V) | Use of<br>fifth erase parameter set<br>(VERA=20.5V, WL=0.1V) | Use of<br>sixth erase parameter set<br>(VERA=20.5V, WL=0.1V) |
| 1001 | | | | |
| 1010 | | | | |
| 1011 | 2K W/E | Use of<br>seventh erase parameter set<br>(VERA=21V, WL=0.1V) | Use of<br>eighth erase parameter set<br>(VERA=21V, WL=0.1V) | Use of<br>ninth erase parameter set<br>(VERA=21V, WL=0.15V) |
| 1100 | | | | |
| 1101 | | | | |
| 1110 | 3K W/E | Use of<br>tenth erase parameter set<br>(VERA=22V, WL=0.05V) | Use of<br>eleventh erase parameter set<br>(VERA=22V, WL=0.1V) | Use of<br>twelfth erase parameter set<br>(VERA=22V, WL=0.2V) |
| 1111 | | | | |

FIG. 21

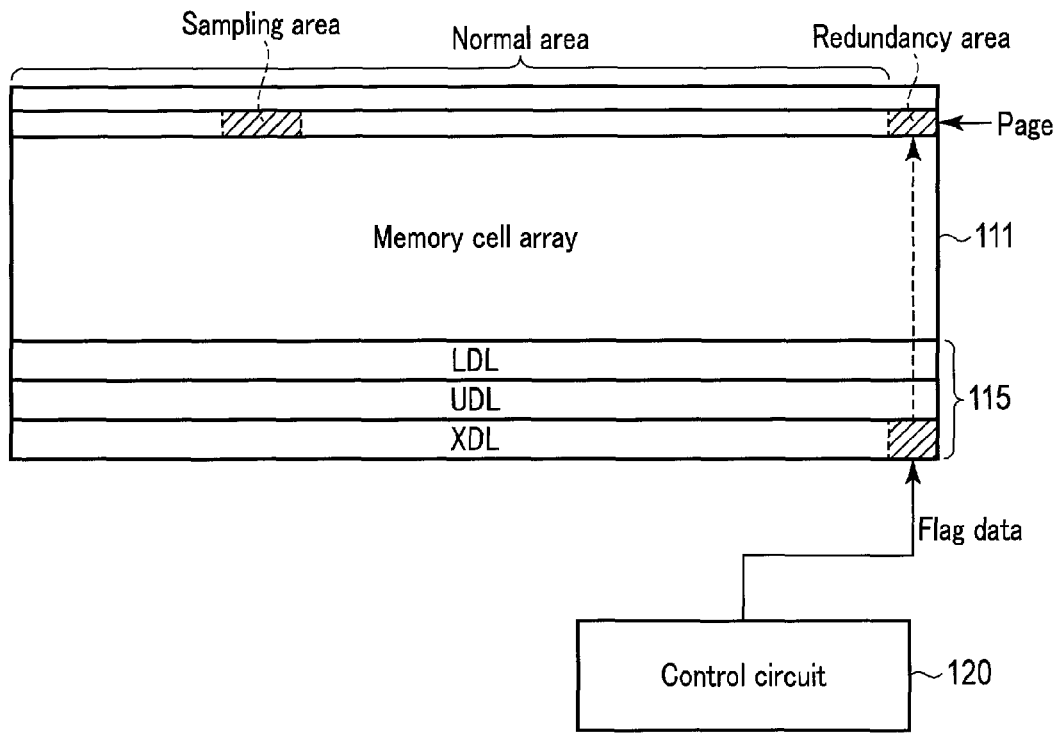
F I G. 22
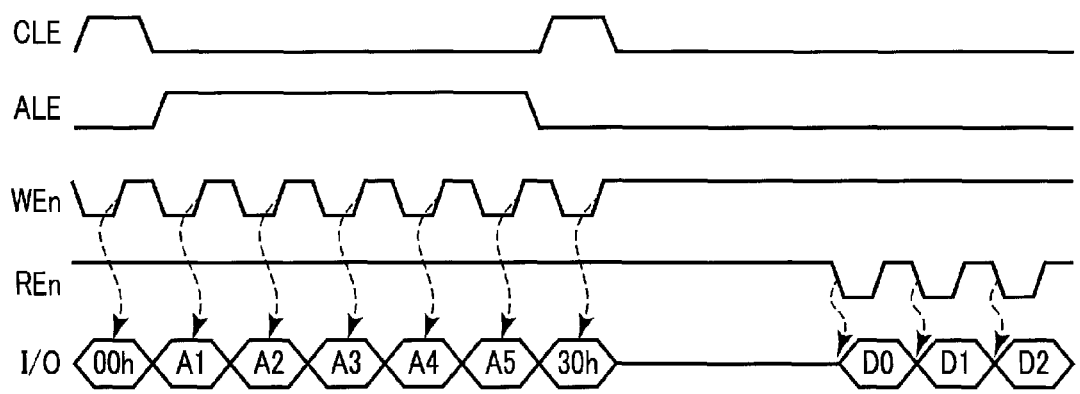
F I G. 23

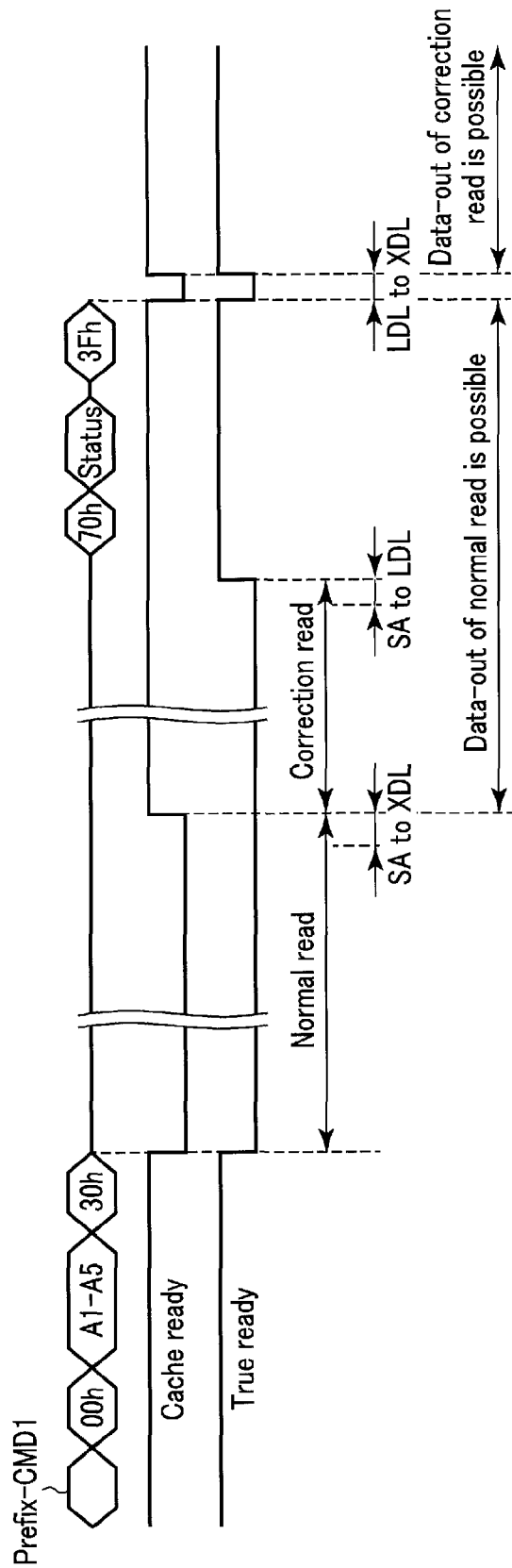
F I G. 27

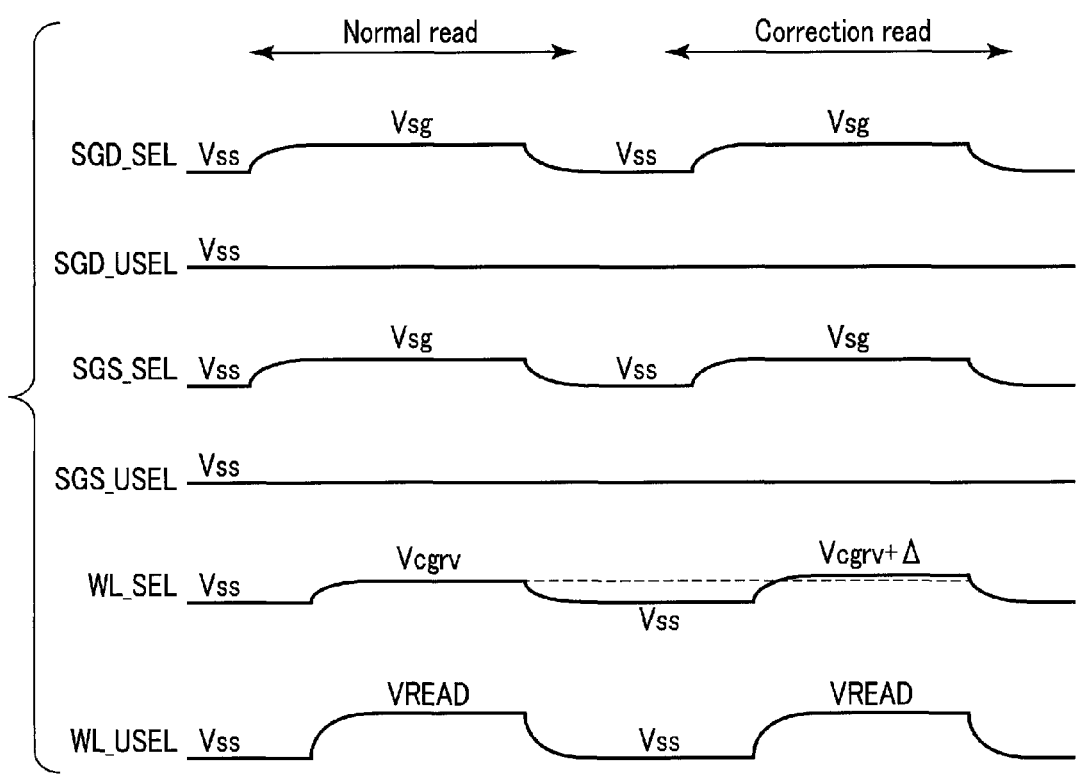
F I G. 28

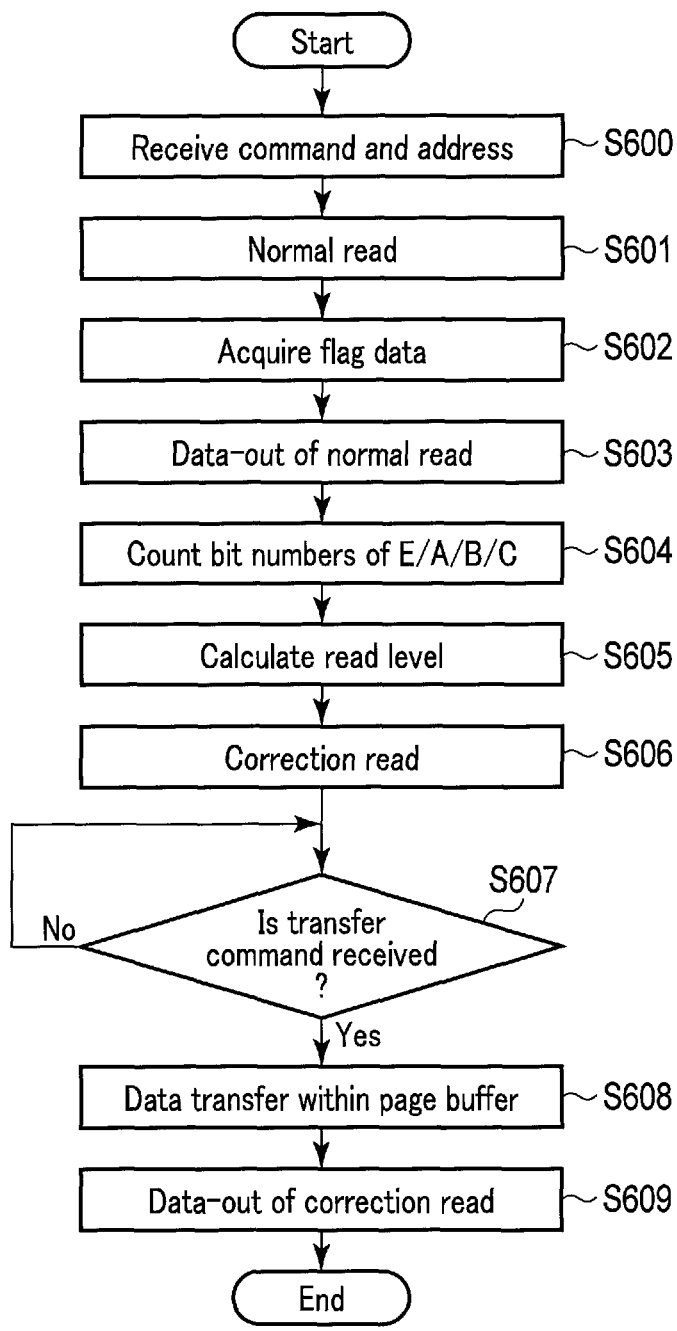
F I G. 29

| Difference | AR level | BR level | CR level |
|---|---|---|---|
| −101 or less | −0.150 | +0.150 | +0.20 |
| −91 ~ −100 | −0.135 | +0.135 | +0.18 |
| −81 ~ −90 | −0.120 | +0.120 | +0.16 |
| −71 ~ −80 | −0.105 | +0.105 | +0.14 |
| −61 ~ −70 | −0.090 | +0.090 | +0.12 |
| −51 ~ −60 | −0.075 | +0.075 | +0.10 |
| −41 ~ −50 | −0.060 | +0.060 | +0.08 |
| −31 ~ −40 | −0.045 | +0.045 | +0.06 |
| −21 ~ −30 | −0.030 | +0.030 | +0.04 |
| −11 ~ −20 | −0.015 | +0.015 | +0.02 |
| −10 ~ 10 | ±0 | ±0 | ±0 |
| 11 ~ 20 | +0.015 | −0.015 | −0.02 |
| 21 ~ 30 | +0.030 | −0.030 | −0.04 |
| 31 ~ 40 | +0.045 | −0.045 | −0.06 |
| 41 ~ 50 | +0.060 | −0.060 | −0.08 |
| 51 ~ 60 | +0.075 | −0.075 | −0.10 |
| 61 ~ 70 | +0.090 | −0.090 | −0.12 |
| 71 ~ 80 | +0.105 | −0.105 | −0.14 |
| 81 ~ 90 | +0.120 | −0.120 | −0.16 |
| 91 ~ 100 | +0.135 | −0.135 | −0.18 |
| 101 or more | +0.150 | −0.150 | −0.20 |

Difference = "Flag data" − "Count value"

F I G. 30

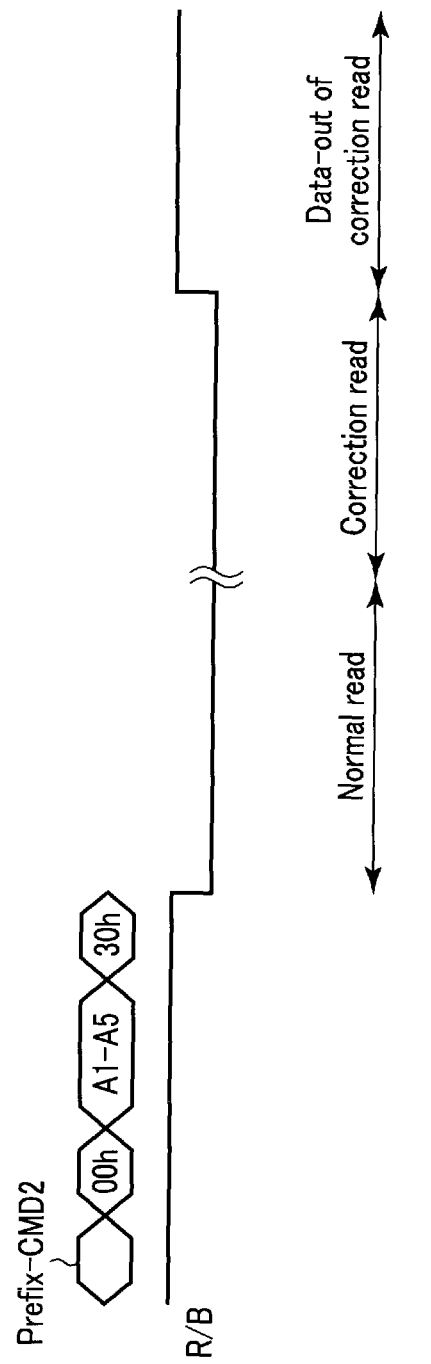
F I G. 31

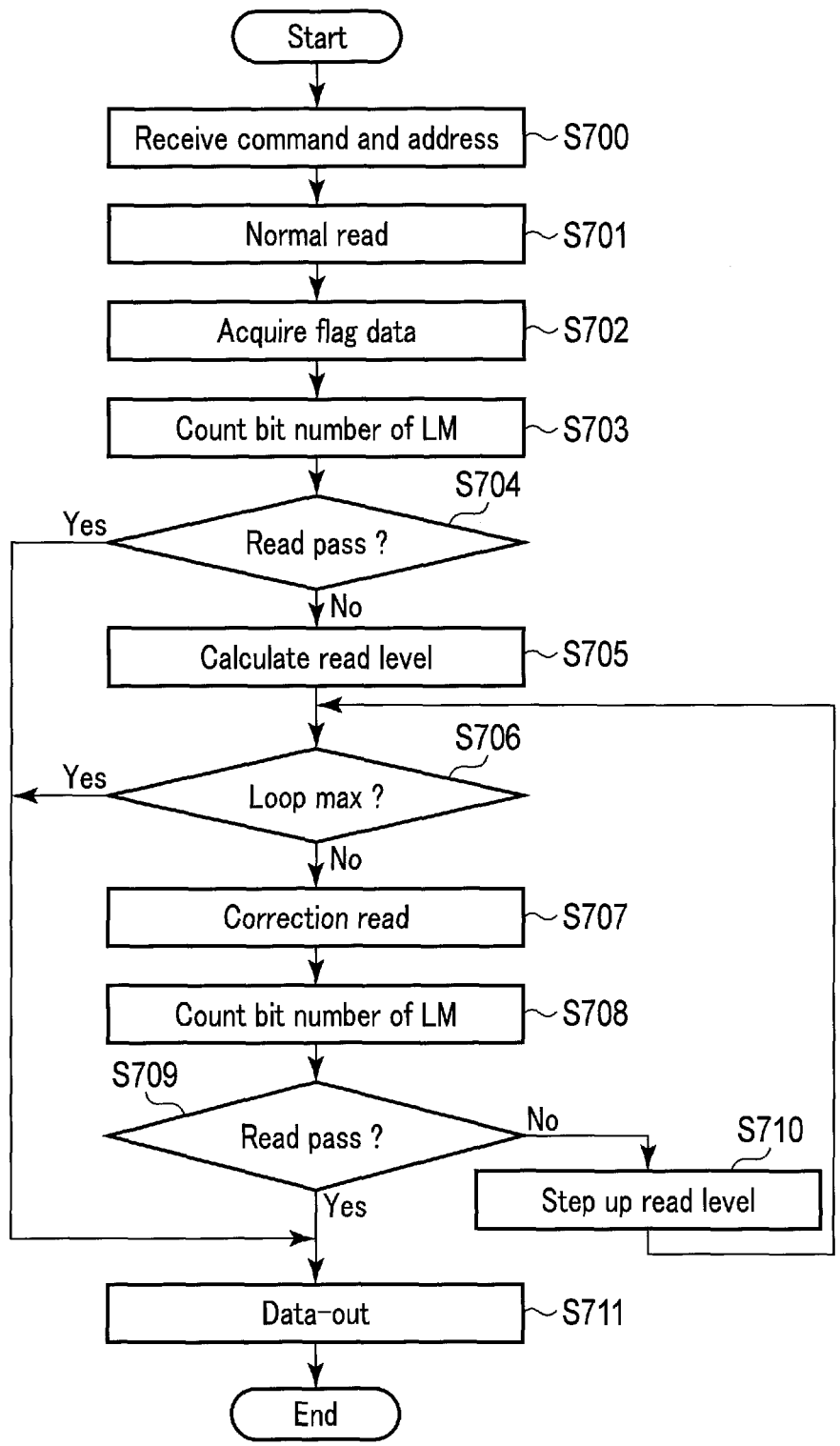
F I G. 32

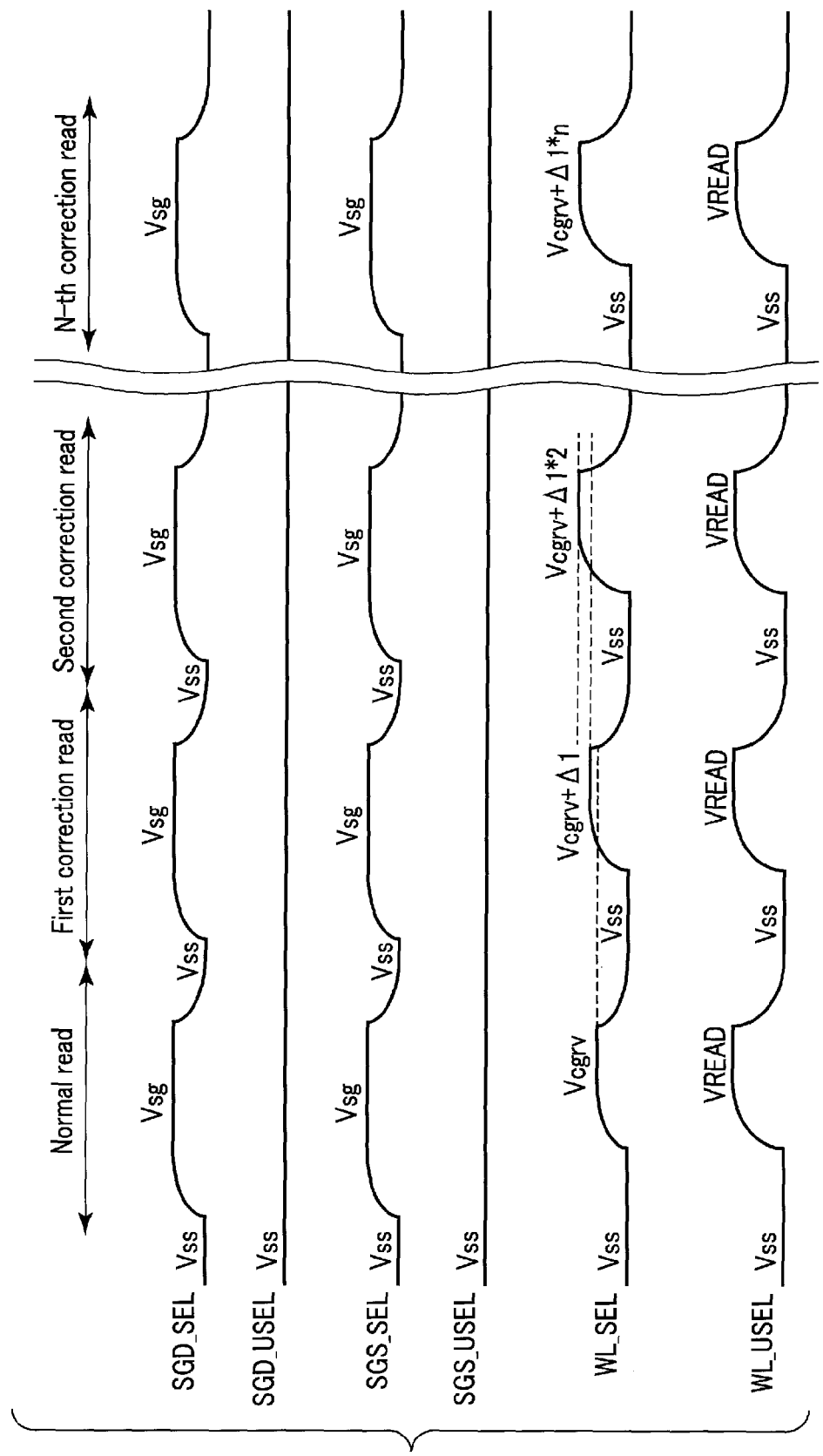
F I G. 33

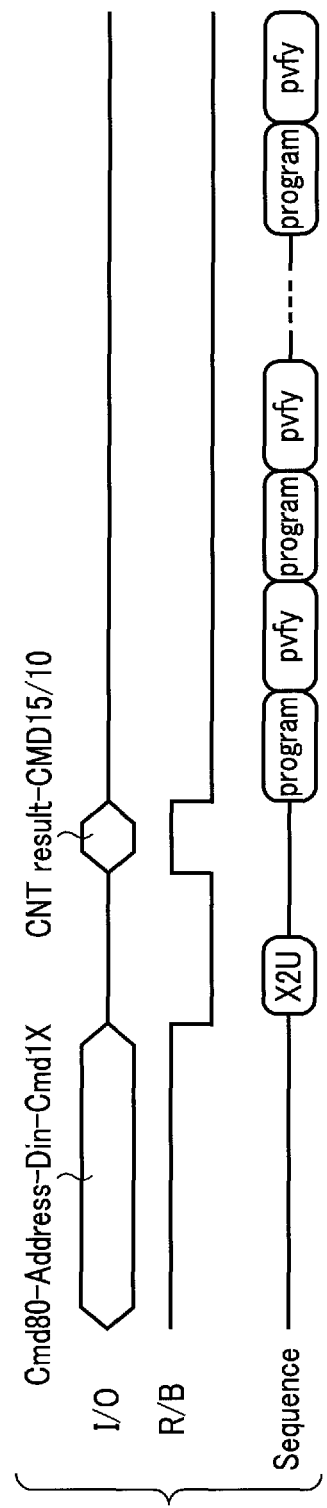
F I G. 34

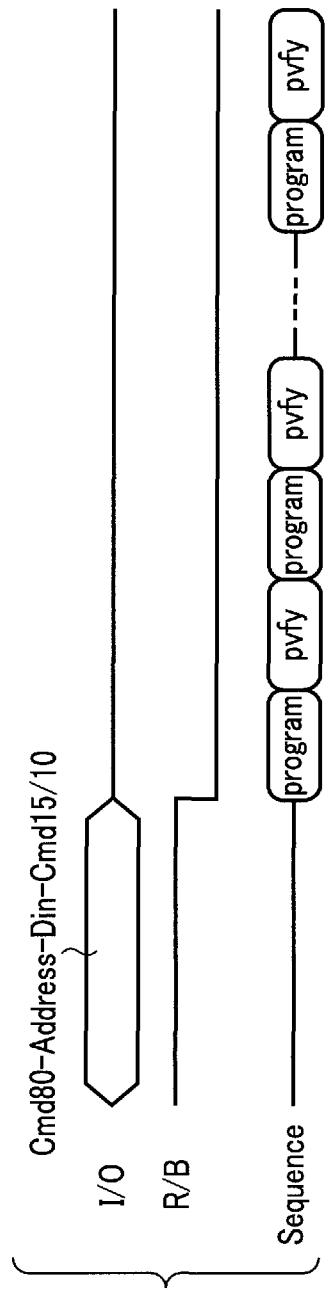
F I G. 38

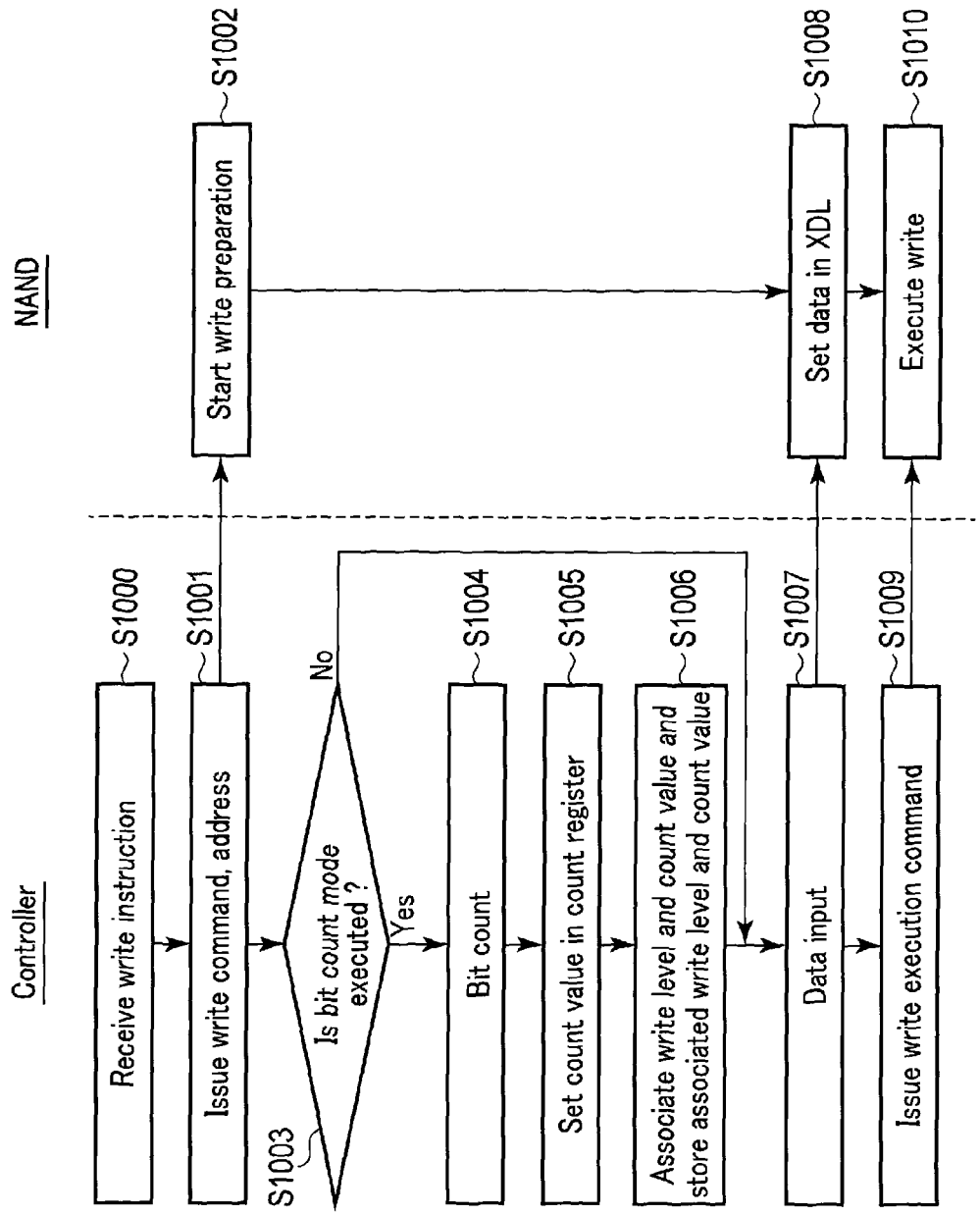
F I G. 39

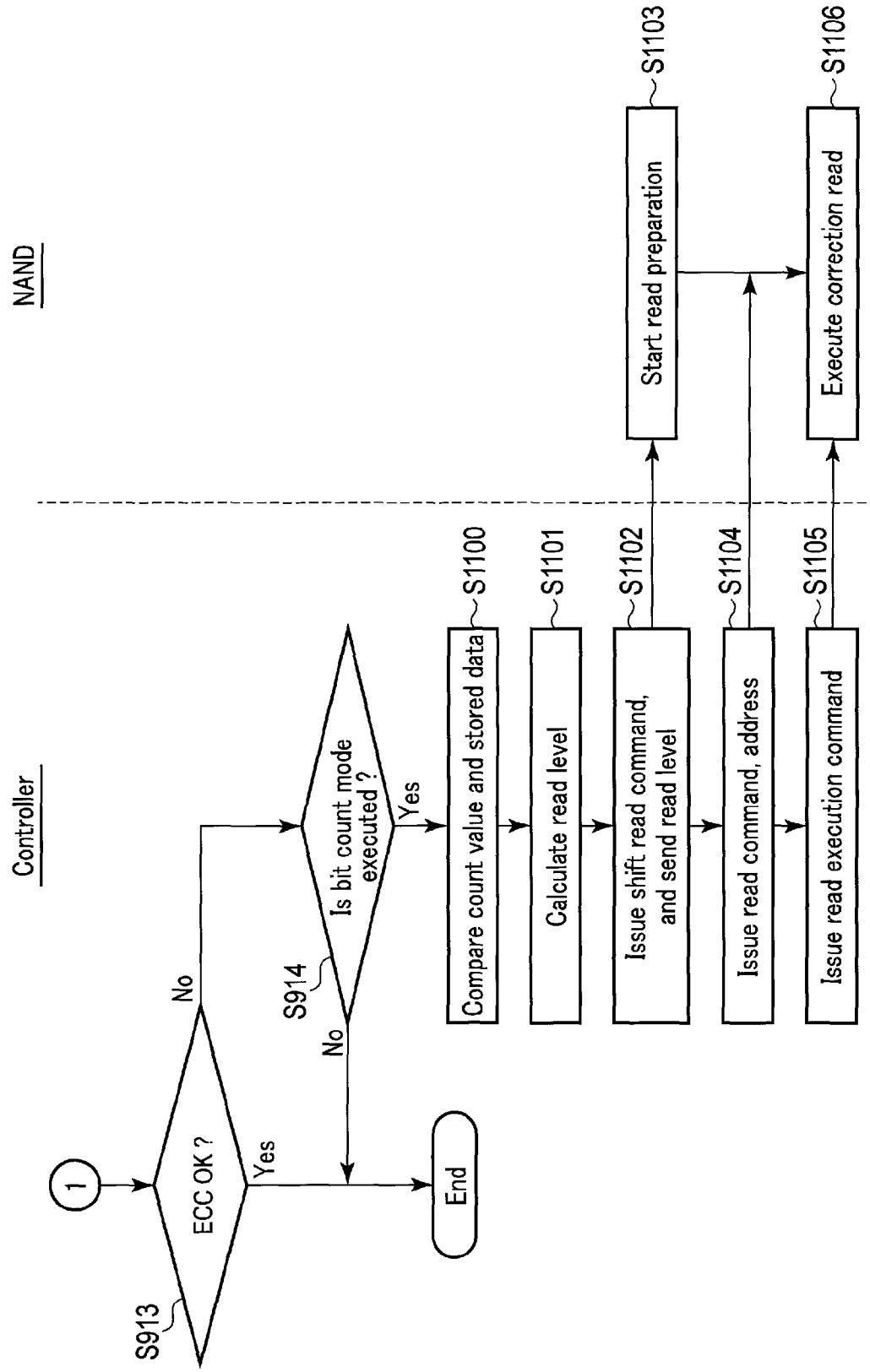
F I G. 40

SEMICONDUCTOR MEMORY DEVICE

CROSS-REFERENCE TO RELATED APPLICATIONS

This application is based upon and claims the benefit of priority from Japanese Patent Application No. 2014-180577, filed Sep. 4, 2014, the entire contents of which are incorporated herein by reference.

FIELD

Embodiments described herein relate generally to a semiconductor memory device.

BACKGROUND

There is known a NAND flash memory in which memory cells are three-dimensionally arranged.

BRIEF DESCRIPTION OF THE DRAWINGS

FIG. 2 is a block diagram of a NAND flash memory according to the first embodiment;

FIG. 4 is a cross-sectional view of a partial region of the memory cell array;

FIG. 10 is a view illustrating a relationship between a signal VBL_DAC and operation parameters;

FIG. 11 is a view illustrating another example of the relationship between the signal VBL_DAC and operation parameters;

FIG. 12 is a timing chart of an erase operation according to the first embodiment;

FIG. 13 is a flowchart of a lower page program operation according to the first embodiment;

FIG. 18 is a timing chart of the upper page program operation according to the first embodiment;

FIG. 19 is a timing chart of a read operation according to the first embodiment;

FIG. 21 is a view illustrating the relationship between the signal VBL_DAC and erase parameter sets;

FIG. 22 is a block diagram illustrating, mainly, a memory cell array according to a second embodiment;

FIG. 23 is a timing chart of a data transfer operation according to the second embodiment;

FIG. 27 is a timing chart of the lower page read operation according to Example 1;

FIG. 28 illustrates voltage waveforms in read operations according to Example 1;

FIG. 29 is a flowchart of an upper page read operation according to Example 1;

FIG. 30 is a view illustrating the relationship between a difference between flag data and a count value, on one hand, and read levels, on the other hand;

FIG. 31 is a timing chart of a read operation according to Example 2;

FIG. 32 is a flowchart of a lower page read operation according to Example 3;

FIG. 33 illustrates voltage waveforms in the lower page read operation according to Example 3;

FIG. 34 is a timing chart illustrating a write operation of a memory controller and a NAND flash memory according to a third embodiment;

FIG. 38 is a timing chart illustrating a write operation of a memory controller and a NAND flash memory according to a fourth embodiment;

FIG. 39 is a flowchart illustrating the write operation of the memory controller and NAND flash memory according to the fourth embodiment; and FIG. 40 is a flowchart illustrating a read operation of the memory controller and NAND flash memory according to the fourth embodiment.

DETAILED DESCRIPTION

Figure 1:
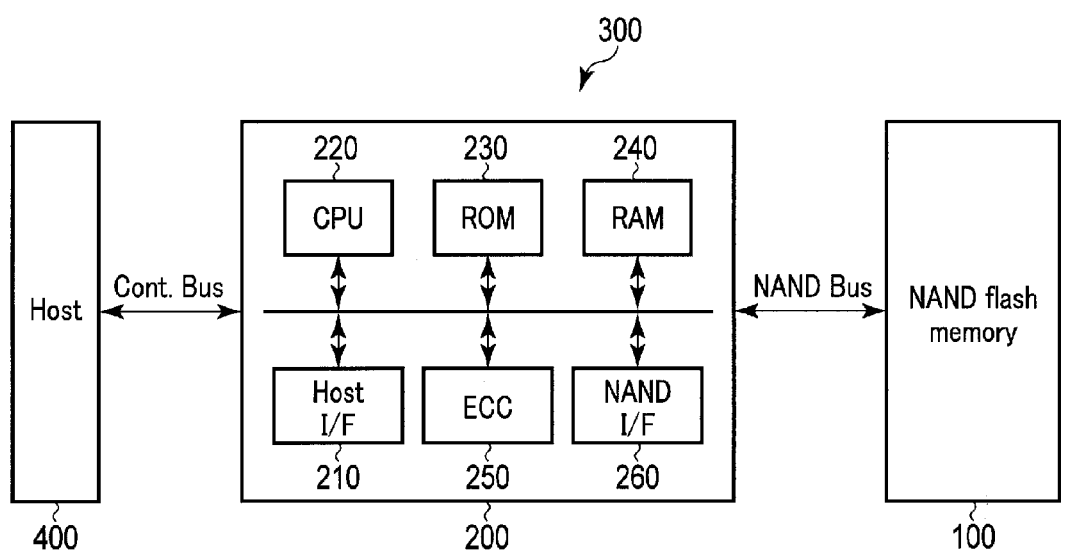
FIG. 1 is a block diagram of a memory system according to a first embodiment.

In general, according to one embodiment, there is provided a semiconductor memory device comprising:
a memory cell array including memory strings, one of the memory strings including memory cells;
word lines commonly connected to the memory strings; and
a controller configured to execute a write operation and a read operation on a page, the page being stored in memory cells connected to one of the word lines,
wherein the controller is configured to
measure a cell current flowing in the memory string, and
adjust a write voltage applied to a word line, based on a result of the cell current.

Embodiments will now be described with reference to the accompanying drawings. The drawings are merely schematic or conceptual, and the dimensions and ratios in these drawings do not necessarily match the actuality. Several embodiments to be described below merely exemplify devices and methods for embodying the technical concepts of the present invention, and the shapes, structures, layouts, and the like of the components do not limit the technical concepts of the present invention. Note that in the following explanation, the same reference numerals denote elements having the same functions and arrangements, and a repetitive explanation will be made only when necessary.

A semiconductor memory device is a nonvolatile semiconductor memory which is capable of electrically rewriting data. In embodiments to be described below, a NAND flash memory will be described as an example of the semiconductor memory device. In addition, a three-dimensional multi-stacked NAND flash memory, in which memory cells are stacked on a semiconductor substrate, will be described as an example of the NAND flash memory.

First Embodiment

[1-1] Configuration of Memory System

First, a description is given of a configuration of a memory system including a semiconductor memory device according to the present embodiment. FIG. 1 is a block diagram of a memory system 300 according to the embodiment. The memory system 300 includes a NAND flash memory 100 and a memory controller 200. Examples of the memory system 300 include a memory card such as an SD™ card, and an SSD (Solid State Drive).

The NAND flash memory 100 includes a plurality of memory cells, and stores data nonvolatilely. The details of the configuration of the NAND flash memory will be described later.

Responding to an instruction from a host device 400, the memory controller 200 instructs the NAND flash memory 100 to execute write, read and erase. In addition, the memory controller 200 manages a memory space of the NAND flash memory 100. The memory controller 200 includes a host interface circuit (Host I/F) 210, a CPU (Central Processing Unit) 220, a ROM (Read Only Memory) 230, a RAM (Random Access Memory) 240, an ECC (Error Checking and Correcting) circuit 250, and a NAND interface circuit (NAND I/F) 260.

The host interface circuit 210 is connected to the host device 400 via a controller bus, and executes an interface process between the host interface circuit 210 and the host device 400. In addition, the host interface circuit 210 transmits/receives instructions and data to/from the host device 400.

The CPU 220 controls the operation of the entirety of the memory controller 200. For example, when the CPU 220 received a write instruction from the host device 400, the CPU 220 responds to the write instruction and issues a write instruction based on the NAND interface. The same applies to the cases of read and erase. In addition, the CPU 220 executes various processes for managing the NAND flash memory 100, such as wear leveling.

The ROM 230 stores firmware, etc. which are used by the CPU 220. The RAM 240 is used as a working area of the CPU 220, and stores firmware which was loaded from the ROM 230, and various tables which the CPU 220 created. The RAM 240 is also used as a data buffer, and temporarily stores data which was sent from the host device 400, and data which was sent from the NAND flash memory 100.

The ECC circuit 250 generates, at a time of data write, an error correction code for write data, adds the error correction code to the write data, and sends the write data with the error correction code to the NAND interface 260. In addition, at a time of data read, the ECC circuit 250 executes error check and correction for read data by using the error correction code included in the read data. Incidentally, the ECC circuit 250 may be provided in the NAND interface circuit 260.

The NAND interface circuit 260 is connected to the NAND flash memory 100 via a NAND bus, and executes an interface process between the NAND interface circuit 260 and the NAND flash memory 100. In addition, the NAND interface circuit 260 transmits/receives instructions and data to/from the NAND flash memory 100.

[1-1-1] Configuration of NAND Flash Memory 100

Next, the configuration of the NAND flash memory 100 is described. FIG. 2 is a block diagram of the NAND flash memory 100 according to the embodiment. The NAND flash memory 100 includes a memory cell array 111, a row decoder (R/D) 112, a sense amplifier unit 113, a page buffer 115, a column decoder 116, a driver 117, a voltage generator (charge pump) 118, an input/output circuit 119, a control circuit 120, an address/command register 121, and a register 122.

The memory cell array 111 includes a plurality of blocks BLK. Each of the blocks BLK is a set of nonvolatile memory cells which are associated with word lines and bit lines, respectively. FIG. 2 illustrates, by way of example, four blocks BLK0 to BLK3. The block BLK is an erase unit of data, and the data in the same block BLK are erased collectively. Each of the blocks BLK includes a plurality of string units SU. Each of the string units SU is a set of NAND strings 114, in each of which memory cells are connected in series. FIG. 2 illustrates, by way of example, four string units SU0 to SU3. Needless to say, the number of blocks BLK and the number of string units SU in one block BLK can arbitrarily be set.

The row decoder 112 receives a block address signal and a row address signal from the address/command register 121. Based on these signals, the row decoder 112 selects word lines in the corresponding block. The column decoder 116 receives a column address signal from the address/command register 121, and selects bit lines, based on the column address signal.

At a time of data read, the sense amplifier unit 113 senses and amplifies data which was read to bit lines from the memory cells. In addition, at a time of data write, the sense amplifier unit 113 transfers write data to memory cells. The read and write of data from and to the memory cell array 111 are executed in units of a plurality of memory cells, and this unit becomes a page.

The page buffer 115 stores data in units of a page. At a time of data read, the page buffer 115 temporarily stores data which was transferred from the sense amplifier unit 113 in units of a page, and serially transfers the data to the input/output circuit 119. In addition, at a time of data write, the page buffer 115 temporarily stores data which was serially transferred from the input/output circuit 119, and transfers the data to the sense amplifier circuit 113 in units of a page.

The input/output circuit 119 transmits/receives various commands and data to/from the memory controller 200 via the NAND bus. The address/command register 121 receives commands and addresses from the input/output circuit 119, and temporarily stores them.

The driver 117 supplies voltages, which are necessary for write, read and erase of data, to the row decoder 112, sense amplifier unit 113, and a source line control circuit (not shown). The voltages generated by the driver 117 are applied to the memory cells (word lines, select gate lines, bit lines, and source lines) via the row decoder 112, sense amplifier unit 113 and source line control circuit. The voltage generator 118 boosts a power supply voltage which is supplied from the outside, and supplies various voltages with the driver 117.

The register 122 temporarily stores, for example, at a time of power-on, management data which was read from a ROM fuse of the memory cell array 111. In addition, the register 122 temporarily stores various data which are necessary for the operation of the memory cell array 111. The register 122 is composed of, for example, an SRAM.

The control circuit 120 controls the operation of the entirety of the NAND flash memory 100.

[1-1-2] Configuration of Memory Cell Array 111

Figure 3:
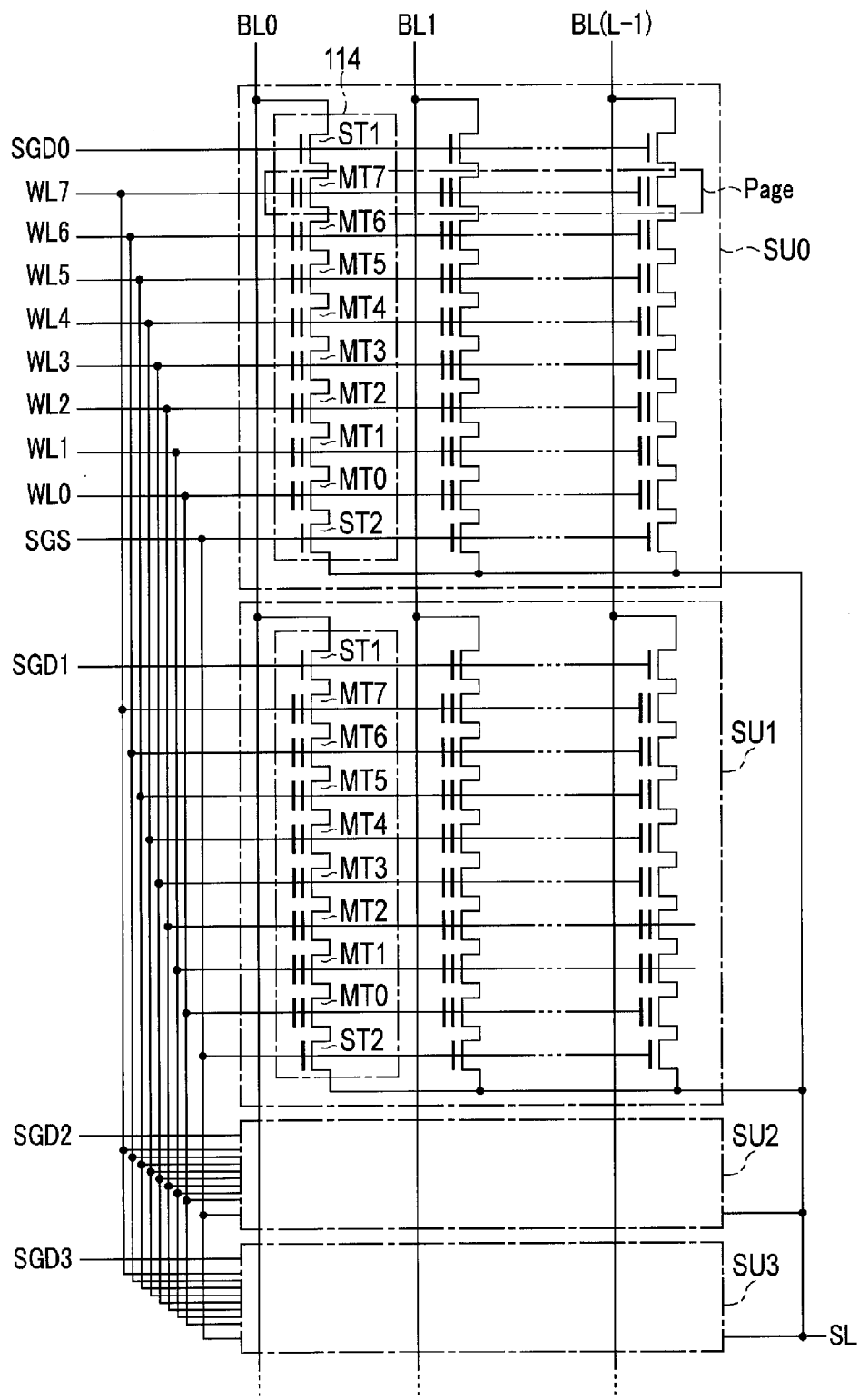
FIG. 3 is a circuit diagram of one block included in a memory cell array.

Next, the configuration of the memory cell array 111 is described. FIG. 3 is a circuit diagram of one block BLK included in the memory cell array 111.

The block BLK includes, for example, four string units SU0 to SU3. Each of the string units SU includes a plurality of NAND strings 114.

Each of the NAND strings 114 includes, for example, eight memory cell transistors MT (MT0 to MT7), and select transistors ST1 and ST2. Incidentally, in the description below, the term "memory cell transistor" and term "memory cell" are identical in meaning. Each of the memory cell transistor MT includes a stacked gate including a control gate and a charge storage layer, and stores data nonvolatilely. In the meantime, the number of memory cell transistors MT is not limited to eight, and may be 16, 32, 64 or 128. The number of memory cell transistors MT can arbitrarily be set. The memory cell transistor MT are disposed such that the current paths of the transistors MT are connected in series between the select transistors ST1, ST2. The current path of the memory cell transistor MT7 on one end side of this series connection is connected to one end of the current path of the select transistor ST1, and the current path of the memory cell transistor MT0 on the other end side of this series connection is connected to one end of the current path of the select transistor ST2.

The gates of the select transistors ST1 included in the string unit SU0 are commonly connected to a select gate line SGD0, and select gate lines SGD1 to SGD3 are connected to the string units SU1 to SU3 in like manner. The gates of select transistors ST2 in the same block BLK are commonly connected to an identical select gate line SGS. The control gates of the memory cell transistors MT0 to MT7 in the same block BLK are commonly connected to word lines WL0 to WL7. Incidentally, like the select transistors ST1, the select transistors ST2 included in the respective string units SU may be connected to different select gate lines SGS0 to SGS3.

In addition, the other ends of the current paths of the select transistors ST1 of the NAND strings 114 of the same row, among the NAND string 114 disposed in a matrix in the memory cell array 111, are commonly connected to any one of bit lines BL0 to BL (L−1). (L−1) is a natural number of 1 or more. Specifically, the bit line BL commonly connects the NAND strings 114 among the blocks BLK. In addition, the other ends of the current paths of the select transistors ST2 are commonly connected to a source line SL. The source line SL commonly connects the NAND strings 114, for example, between a plurality of blocks.

As described above, the data of memory cell transistors MT in the same block BLK are erased collectively. On the other hand, data read/write is collectively executed for the memory cell transistors MT, which are commonly connected to any one of the word lines WL, in any one of the string units SU of any one of the blocks BLK. This unit of data read/write is called "page".

Next, an example of a cross-sectional configuration of the memory cell array 111 is described. FIG. 4 is a cross-sectional view of a partial region of the memory cell array 111.

A wiring layer 20 functioning as the source line SL is formed above a semiconductor substrate (not shown). A conductive film 21a functioning as the select gate line SGS is formed above the source line SL. A plurality of conductive films 22 functioning as word lines WL are formed above the conductive film 21a. A conductive film 21b functioning as the select gate line SGD is formed above the conductive film 22. Inter-electrode insulation films for electrically isolating the conductive films 21a, 21b and 22 are formed between the conductive films 21a, 21b and 22.

In addition, a memory hole is formed in the conductive films 21a, 21b and 22 and inter-electrode insulation films. The memory hole penetrates the conductive films 21a, 21b and 22 and inter-electrode insulation films, and extends in a vertical direction (direction D3) to the surface of the semiconductor substrate. For example, due to fabrication steps, the diameter of the memory hole becomes greater in an upward direction. Furthermore, a difference between the diameter of a lower part of the memory hole and the diameter of an upper part of the memory hole becomes larger as the length of the memory hole becomes larger.

In the memory hole formed in a region which becomes the select transistor ST2, a gate insulation film 23a and a semiconductor layer 24a are successively formed, and a pillar structure including the gate insulation film 23a and semiconductor layer 24a is formed. In the memory hole formed in a region which becomes the memory cell transistor MT, a block insulation film 25, a charge storage layer (insulation film) 26, a gate insulation film 27 and a semiconductor layer 28 are successively formed, and a pillar structure including these films and layers is formed. In the memory hole formed in a region which becomes the select transistor ST1, a gate insulation film 23b and a semiconductor layer 24b are successively formed, and a pillar structure including the gate insulation film 23b and semiconductor layer 24b is formed. The semiconductor layers 24a, 28 and 24b are a region which functions as a current path of the NAND string 114, and in which a channel is formed when the memory cell transistors MT operates.

In this manner, in each NAND string 114, the select transistor ST2, memory cell transistors MT and select transistor ST1 are successively stacked. A wiring layer 29 functioning as the bit line BL is formed on the semiconductor layer 24b. The bit line BL is formed to extend in a direction D1.

A plurality of the above-described structures are arranged in a depth direction (direction D2) of FIG. 4, and the string unit SU is formed of a set of NAND strings 114 which are arranged in the direction D2. In addition, the plural select gate lines SGD, plural select gate lines SGS and plural word lines WL included in the same string unit SU are commonly connected, respectively.

In the meantime, as regards the configuration of the memory cell array 111, the memory cell array 111 may have other configurations. For example, the configuration of the memory cell transistor 111 is disclosed in U.S. patent application Ser. No. 12/407,403 filed on Mar. 19, 2009, titled "Three dimensional stacked nonvolatile semiconductor memory". In addition, the configurations of the memory cell transistor 111 are disclosed in U.S. patent application Ser.

No. 12/406,524 filed on Mar. 18, 2009, titled "Three dimensional stacked nonvolatile semiconductor memory"; U.S. patent application Ser. No. 12/679,991 filed on Mar. 25, 2010, titled "Nonvolatile semiconductor memory device and manufacturing method of the same"; and U.S. patent application Ser. No. 12/532,030 filed on Mar. 23, 2009, titled "Semiconductor memory and method for manufacturing the same". The entire contents of these patent applications are incorporated herein by reference.

[1-1-3] Threshold Distribution of Memory Cell Transistor MT

Figure 5:
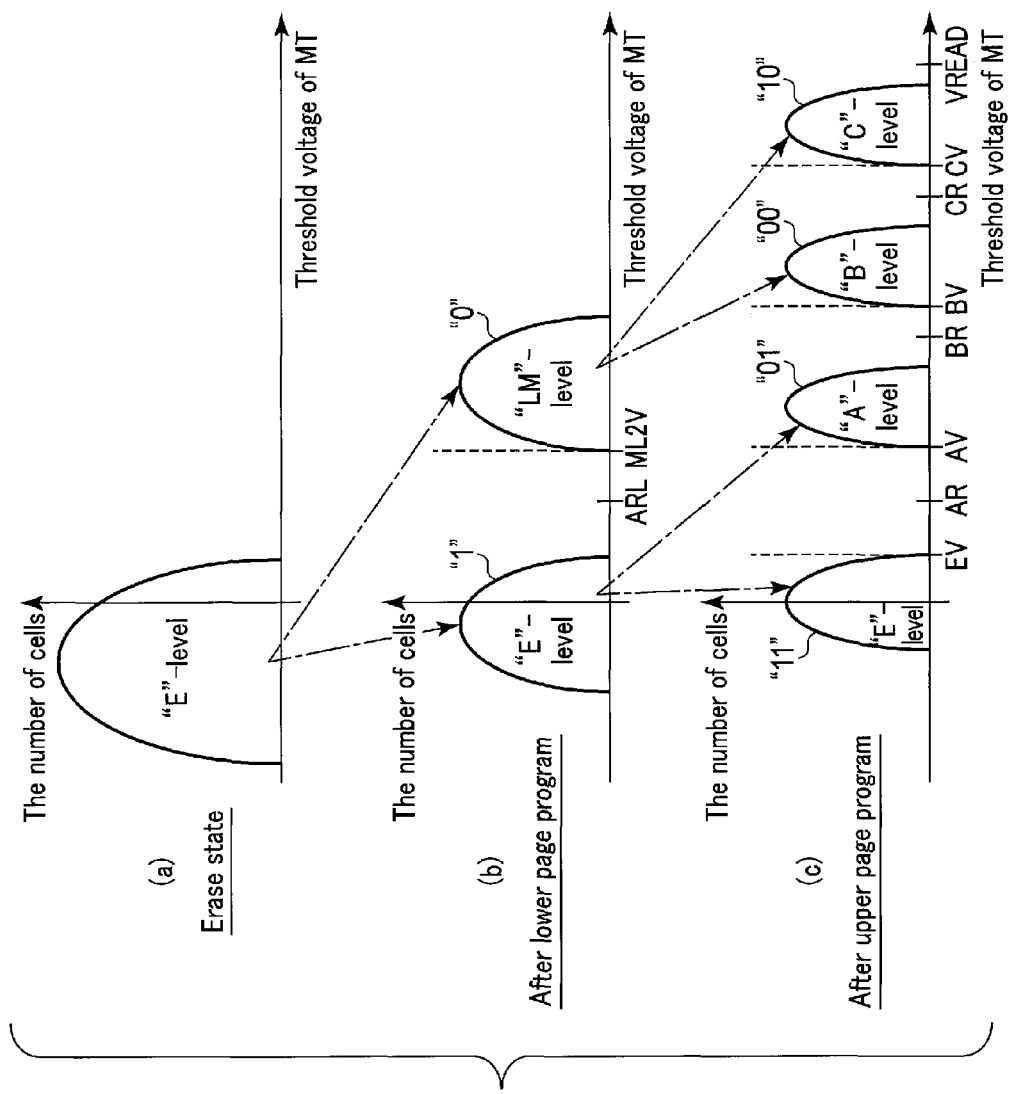
FIG. 5 is a view for explaining a threshold distribution of a memory cell transistor.

Next, a description is given of an example of a threshold distribution (threshold voltage distribution) of the memory cell transistor MT. FIG. 5 is a view for explaining the threshold distribution of the memory cell transistor MT.

For example, the memory cell transistor MT can store data of two bits in accordance with thresholds thereof. Two-bit data, which are stored in the memory cell transistor MT are, for example, "11", "01", "00", and "10" in an order from the lowest threshold. As regards "11", "01", "00", and "10", the left-side numeral indicates an upper bit, and the right-side numeral indicates a lower bit. A write unit of lower-bit data is called "lower page", and a write unit of upper-bit data is called "upper page".

If lower page program is executed, a threshold distribution of an erase state ("E" level) illustrated in part (a) of FIG. 5 changes to two threshold distributions illustrated in part (b) of FIG. 5, namely a threshold distribution of an erase state ("E" level) and a threshold distribution of a middle level ("LM" level). The "LM" level has a higher threshold than a read level ARL. The "LM" level is programmed by using a verify level ML2V which is slightly higher than the read level ARL, and the "LM" level has a higher threshold than the verify level ML2V. The "E" level is associated with data "1", and the "LM" level is associated with data "0".

If upper page program is executed after the lower page program, the two threshold distributions illustrated in part (b) of FIG. 5 change to four threshold distributions as illustrated in part (c) of FIG. 5. The memory cell transistor MT can take a threshold of any one of the "E" level, "A" level, "B" level and "C" level. The "E" level, "A" level, "B" level and "C" level are associated with data "11", "01", "00" and "10", respectively.

The "E" level is a threshold in a state in which charge in the charge storage layer is drawn out and the data is erased, and has, for example, a negative value. The "E" level is lower than a verify voltage EV. The "A" to "C" levels are thresholds in states in which charge is injected in the charge storage layer, and have, for example, positive values. The "A" level has a threshold which is higher than the read level AR and is lower than a read level BR. The "B" level has a threshold which is higher than the read level BR and is lower than a read level CR. The "C" level has a threshold which is higher than the read level CR and is lower than a voltage VREAD.

The "A" level is programmed by using a verify level AV which is slightly higher than the read level AR, and the "A" level has a higher threshold than the verify level AV. The "B" level is programmed by using a verify level BV which is slightly higher than the read level BR, and the "B" level has a higher threshold than the verify level BV. The "C" level is programmed by using a verify level CV which is slightly higher than the read level CR, and the "C" level has a higher threshold than the verify level CV.

[1-1-4] Configurations of Sense Amplifier Unit 113 and Page Buffer 115

Figure 6:
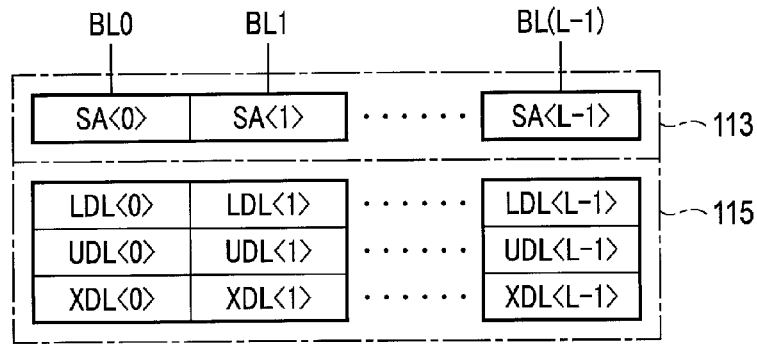
FIG. 6 is a block diagram of a sense amplifier unit and a page buffer.

Next, the configurations of the sense amplifier unit 113 and page buffer 115 are described. FIG. 6 is a block diagram of the sense amplifier unit 113 and page buffer 115.

The sense amplifier unit 113 includes sense amplifiers SA<0> to SA<L−1> which are provided in association with the bit lines BL0 to BL(L−1), respectively. Each of the sense amplifiers SA senses and amplifies data which was read to the corresponding bit line BL, and transfers write data to the corresponding bit line BL.

The page buffer 115 includes, for example, three data caches LDL, UDL, and XDL. For example, the data cache LDL is used for temporarily storing a lower page, the data cache UDL is used for temporarily storing an upper page, and the data cache XDL is connected to the input/output circuit 119 and temporarily stores data that was sent from the input/output circuit 119 and data that is to be sent to the input/output circuit 119. Specifically, even when the data caches LDL and UDL are being used, the page buffer 115 can receive data from the input/output circuit 119 by using the data cache XDL. Like the sense amplifiers SA<0> to SA<L−1>, each of the data caches LDL, UDL and XDL includes an L-number of data cache portions which are provided in association with the bit lines BL0 to BL(L−1).

[1-1-5] Configurations of Sensor Amplifier SA and Cell Current Measuring Circuit 40

Figure 7:
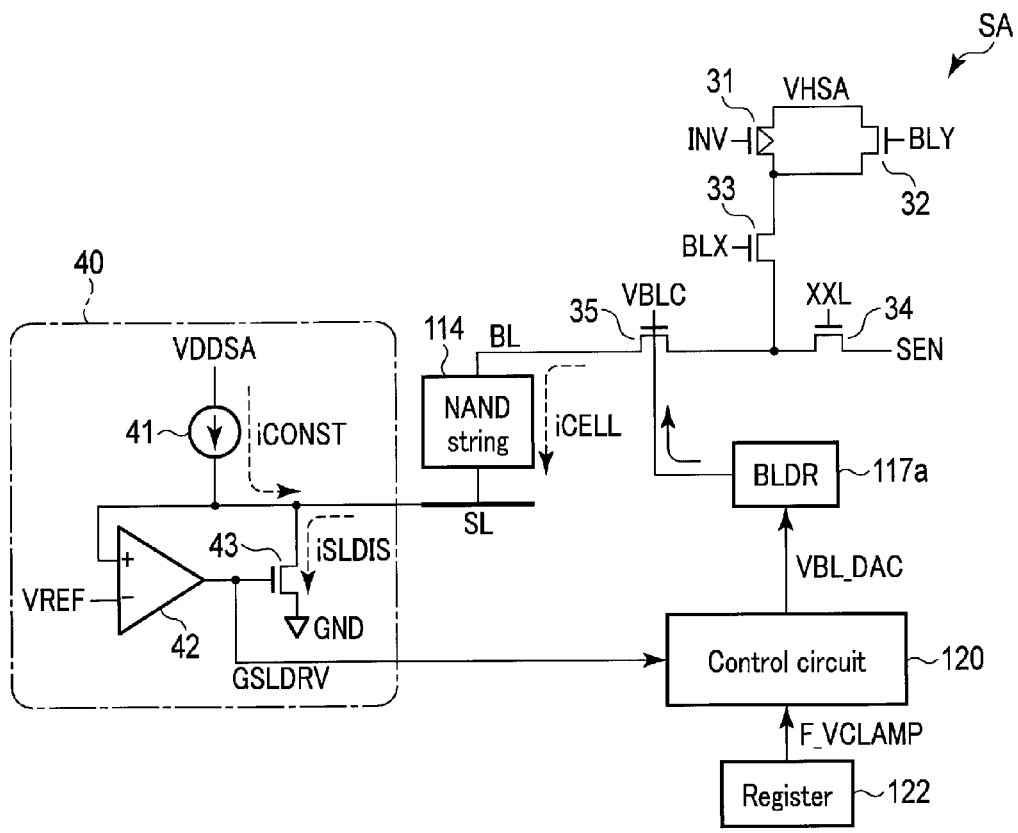
FIG. 7 is a circuit diagram of a main part of a sense amplifier and a cell current measuring circuit.

Next, the configurations of the sense amplifier SA and a cell current measuring circuit 40 are described. FIG. 7 is a circuit diagram of a main part of the sense amplifier SA and the cell current measuring circuit 40.

First, the configuration of the sense amplifier 40 is described. The sense amplifier SA includes a p-channel MOS transistor 31, and n-channel MOS transistors 32 to 35.

A signal VBLC is input to the gate of the transistor 35, and one end of the current path of the transistor 35 is connected to the corresponding bit line BL. The transistor 35 has a function of clamping the corresponding bit line BL at a voltage corresponding to the level of the signal VBLC. The signal VBLC is supplied from a bit line driver (BLDR) 117a which is included in the driver 117. One end of the current path of the transistor 34 is connected to the other end of the current path of the transistor 35, the other end of the current path of the transistor 34 is connected to a node SEN, and a signal XXL is input to the gate of the transistor 34.

One end of the current path of the transistor 33 is connected to the other end of the current path of the transistor 35, and a signal BLX is input to the gate of the transistor 33. One end of the current path of the transistor 32 is connected to the other end of the current path of the transistor 33, a power supply voltage VHSA is applied to the other end of the current path of the transistor 32, and a signal BLY is input to the gate of the transistor 32. One end of the current path of the transistor 31 is connected to the other end of the current path of the transistor 33, the power supply voltage VHSA is applied to the other end of the current path of the transistor 31, and a signal INV is input to the gate of the transistor 31. The transistors 31 and 32 constitute a transfer gate.

At a time of data read, the signals BLX and BLY are set at "H" level, the signal INV is set at "L" level, and the transfer gate (transistors 31, 32) and the transistor 33 are set in the ON state. Thereby, a cell current iCELL flows through the transistor 35, bit line BL and NAND string. At this time, the ON state of the transistor 35 is controlled in accordance with the level of the signal VBLC, and the cell current iCELL is controlled.

If data of a selected memory cell is read to the bit line BL, the signal XXL is set at "H" level, and the transistor 34 is set in the ON state. Thereby, the data, which was read to the bit line BL, is transferred to the node SEN. Further, the data, which was transferred to the node SEN, is stored in any one of the data caches of the page buffer 115.

Next, the configuration of the cell current measuring circuit 40 is described. The cell current measuring circuit 40 has a function of keeping the source line SL at a certain voltage. The cell current measuring circuit 40 is provided for each source line SL. The cell current measuring circuit 40 includes a constant-current source 41, an operational amplifier 42, and an n-channel MOS transistor 43. The control circuit 120 may include the cell current measuring circuit 40, or a source line control circuit (not shown) may include the cell current measuring circuit 40.

The constant-current source 41 supplies a constant-current iCONST to the source line SL. The constant-current source 41 is connected between a power supply voltage VDDSA and the source line SL. The drain of the transistor 43 is connected to the source line SL, and a ground voltage GND is applied to the source of the transistor 43. A positive input terminal of the operational amplifier 42 is connected to the source line SL, a reference voltage VREF is applied to a negative input terminal of the operational amplifier 42, and an output terminal of the operational amplifier 42 is connected to the gate of the transistor 43. In addition, a signal GSLDRV, which is output from the output terminal of the operational amplifier 42, is input to the control circuit 120.

In the meantime, the circuit for measuring the cell current is not limited to the configuration of FIG. 7. For example, the circuit is disclosed in U.S. patent application Ser. No. 13/832,983 filed on Mar. 15, 2013, titled "Semiconductor memory device". The entire contents of the patent application are incorporated herein by reference.

[1-2] Operation

Next, the operation of the NAND flash memory 100 with the above-described configuration is described.

[1-2-1] Cell Current Measuring Operation

Figure 8:
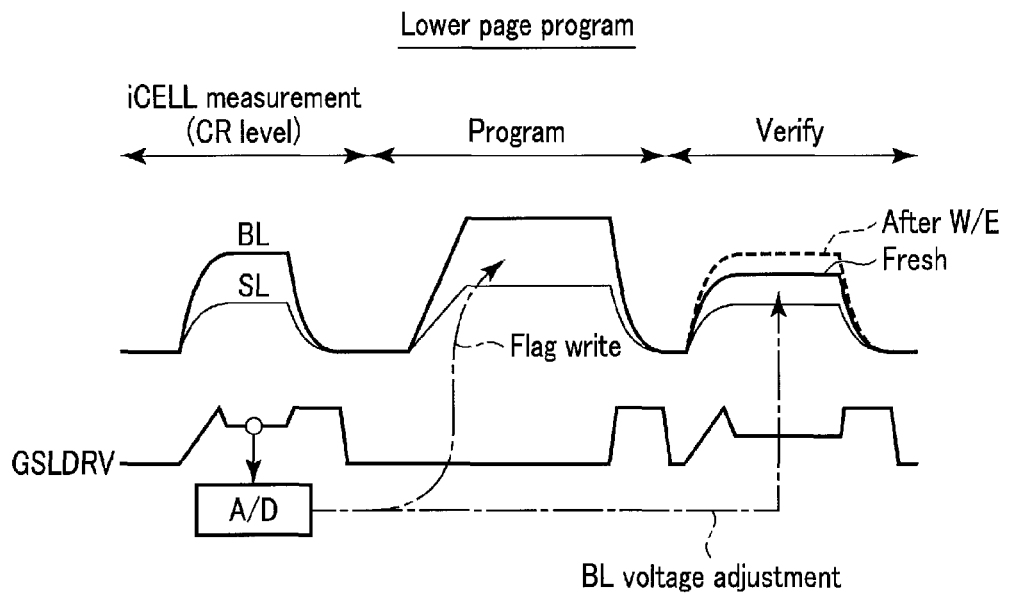
FIG. 8 is a timing chart of a lower page program operation including a cell current measuring operation according to the first embodiment.

First, a cell current measuring operation is described. The cell current measuring operation is included in a lower page program operation. FIG. 8 is a timing chart of the lower page program operation including the cell current measuring operation. FIG. 8 illustrates waveforms of the bit line BL, source line SL, and signal GSLDRV which is output from the cell current measuring circuit 40. The cell current measuring operation is executed in a first step of the lower page program operation.

Before lower page program is executed, the memory cell transistor is in an erase state (a state in which no data is written). The control circuit 120 executes a read operation on a selected page that is a target of lower page program, by using a level at which the memory cell transistor in the erase state is turned on, for example, by using the read level CR.

As illustrated in FIG. 7, the constant-current source 41 included in the cell current measuring circuit 40 supplies a constant-current iCONST to the source line SL. Thereby, a cell current iCELL flows in the source line SL from the bit line BL, and the constant-current iCONST flows in the source line SL from the constant-current source 41. On the other hand, from the source line SL, a discharge current iSLDIS flows toward a ground terminal GND via the transistor 43. Thus, the voltage of the source line SL varies due to a balance between the incoming cell current iCELL and constant-current iCONST and the outgoing discharge current iSLDIS.

The magnitude of the discharge current iSLDIS is controlled by the transistor 43. The degree of conductivity of the transistor 43 is controlled by the output signal GSLDRV of the operational amplifier 42. The output signal GSLDRV is an analog signal which is representative of a comparison result between the voltage of the source line SL and reference voltage VREF by the operational amplifier 42. Accordingly, as the voltage of the source line SL is higher, compared to the reference voltage VREF, the value of the output signal GSLDRV becomes greater to the positive side, the degree of conductivity of the transistor 43 becomes higher, and the discharge current iSLDIS becomes larger. As a result, the voltage of the source line SL lowers. Conversely, as the voltage of the source line SL is lower, compared to the reference voltage VREF, the value of the output signal GSLDRV becomes greater to the negative side, the degree of conductivity of the transistor 43 becomes lower, and the discharge current iSLDIS becomes smaller. As a result, the voltage of the source line SL rises. In this manner, the voltage of the source line SL continues to be constantly feedback-controlled in a manner to approach the reference voltage VREF.

The control circuit 120 receives the output signal GSLDRV of the operational amplifier 42, and analog/digital (A/D) converts the output signal GSLDRV. Subsequently, the control circuit 120 varies a signal VBL_DAC until the signal GSLDRV becomes equal to a reference signal F_VCLAMP that is a target. The signal F_VCLAMP is stored, for example, in the register 122. The signal VBL_DAC is supplied to the bit line driver 117a. The bit line driver 117a generates the signal VBLC, based on the signal VBL_DAC, and supplies the signal VBLC to the gate of the transistor 35 included in the sense amplifier SA. At last, an optimal (target) cell current iCELL is realized in accordance with the signal VBLC that was adjusted by the signal VBL_DAC. The signal VBL_DAC, which was acquired in the iCELL measuring phase and was optimized, is set as flag data in a redundancy area of the page in a program phase.

Figure 9:
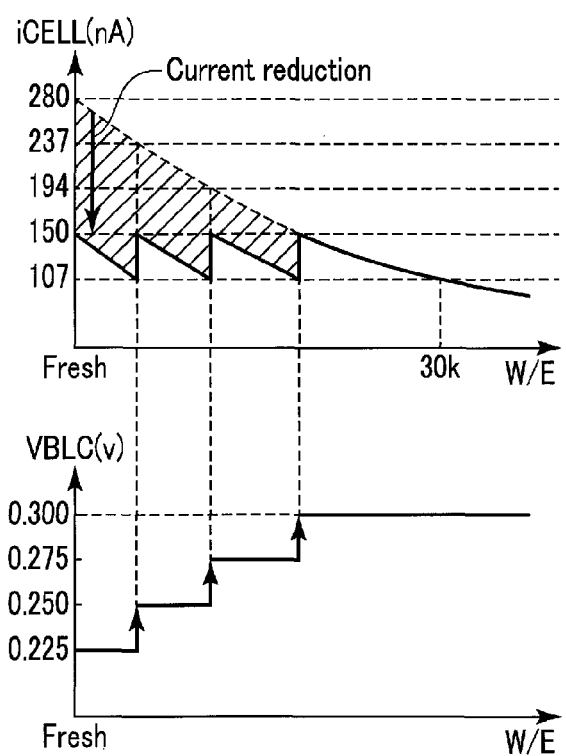
FIG. 9 is a graph for explaining an example of the relationship between a signal VBLC and a cell current iCELL.

FIG. 9 is a graph for explaining an example of the relationship between the signal VBLC and cell current iCELL. An abscissa in FIG. 9 indicates the number of times of write/erase (W/E number). In FIG. 9, "Fresh" indicates a state in which the number of times of write/erase of the NAND flash memory 100 is substantially zero, for example, a state at a time of product shipment.

In the example of FIG. 9, the target value of the cell current iCELL is about 107 nA. In general, as the W/E number increases, the cell current iCELL lowers. Thus, if the level of the signal VBLC is constant regardless of the W/E number, the cell current iCELL becomes large when the W/E number is small, that is, the current consumption increases. On the other hand, in the present embodiment, the cell current is measured at a time of write, and the optimal signal VBLC is generated so that the cell current iCELL may become the target value. Thereby, the cell current iCELL, in particular, at a time when the W/E number is small, can be reduced.

In the meantime, in the lower page program, an operation is executed for loading write data (lower page data) in the data cache in the page buffer 115 from the input/output circuit 119. Thus, the cell current measuring operation in this embodiment may be executed in parallel with the data load operation. Thereby, in the lower page program, there is no need to newly provide a time for executing the cell current measuring operation.

[1-2-2] Setting of Operation Parameters

As described above, as the W/E number increases, the cell current iCELL decreases. Thus, in the present embodiment, the degree of degradation of the memory cell array is determined by utilizing the VBL_DAC which is used in order to control the cell current iCELL. Then, in accordance with the determined degree of degradation of the memory cell array, the operation parameters of the memory cell array 111 are changed. Specifically, based on the degree of degradation of the memory cell array, the parameters of voltages, which are used for the program operation, read operation and erase operation, are corrected.

FIG. 10 is a view illustrating a relationship between the signal VBL_DAC and operation parameters. A program parameter set includes an initial program voltage IVPGM which is used in an initial program loop, and a step-up voltage DVPGM which increases each time a program loop is executed. In addition, the program parameter set may include a verify parameter set. The verify parameter set includes a verify level and a voltage VRAED. A read parameter set includes a read level and a voltage VRAED. Various parameter sets are stored in the register 122.

The signal VBL_DAC is, for example, a 4-bit signal. At the time of product shipment, it is assumed that the voltage setting (e.g. BL=0.4 V) corresponds to the signal VBL_DAC=0100 at a time of read and verify. As the W/E number becomes larger, the cell current decreases and the signal VBL_DAC increases. However, up to the signal VBL_DAC=0111, the same treatment as in the fresh state is adopted and a first program parameter set is used.

At a time point when the signal VBL_DAC has reached VBL_DAC=1000, it is determined that the W/E number has reached 1K (1000 times), and a change is made to a second program parameter set. In addition, at a time point when the signal VBL_DAC has reached VBL_DAC=1011, it is determined that the W/E number has reached 2K, and a change is made to a third program parameter set. Furthermore, at a time point when the signal VBL_DAC has reached VBL_DAC=1110, it is determined that the W/E number has reached 3K, and a change is made to a fourth program parameter set.

For example, if the W/E number reaches about 3K, the write time becomes shorter (i.e. the number of program loops decreases), and the threshold distribution becomes wider. Thus, in the fourth program parameter set, for example, the initial program voltage IVPGM and step-up voltage DVPGM are set to be low. Thereby, a threshold distribution, which is equal to the threshold distribution in the fresh state, can be realized. As regards the second and third program parameter sets, too, parameter correction corresponding to the degree of degradation of the memory cell array is executed.

FIG. 11 is a view illustrating another example of the relationship between the signal VBL_DAC and operation parameters. In the example of FIG. 11, the signal VBL_DAC is trimmed such that the cell current iCELL becomes the target value at the time of product shipment. Although the normal design target is the signal VBL_DAC=0100, it is assumed that the cell current iCELL reached the target value when the signal VBL_DAC=0001, due to variances in fabrication. As illustrated in FIG. 11, the parameter sets, as a whole, are shifted upward by "3". In this chip, when the signal VBL_DAC has reached VBL_DAC=0101, it is determined that the design target is "1K W/E".

Incidentally, the erase parameter sets, like the program parameter sets, are changed based on the signal VBL_DAC. As illustrated in FIG. 12, in order to change the erase parameter set, flag data corresponding to the signal VBL_DAC is read in the erase operation. Then, based on the flag data, the erase parameter set is changed. The erase parameter set includes an erase voltage VERA and a WL voltage, which are used at the time of erase, and a BL voltage and a WL voltage, which are used at the time of erase verify.

Besides, the program parameter set, read parameter set and erase parameter set illustrated in FIG. 10 and FIG. 11 may be changed at the same time, or may be changed individually.

[1-2-3] Lower Page Program Operation

Next, a lower page program operation is described. FIG. 13 is a flowchart of the lower page program operation.

In a first step of the program operation, the control circuit 120 executes a cell current measuring operation by using, for example, a read level CR (step S100). The cell current measuring operation is as described above. In the cell current measuring operation, the control circuit 120 acquires a signal VBL_DAC (step S101). In addition, the control circuit 120 sets the signal VBL_DAC as flag data in a redundancy area of the page.

Subsequently, based on the signal VBL_DAC, the control circuit 120 selects a program parameter set (step S102). The selection of the program parameter set is executed as illustrated in FIG. 10 (or FIG. 11). The selected program parameter set is used through a plurality of program loops.

Subsequently, the control circuit 120 determines whether the program loop number has reached a maximum value or not (step S103). If the program loop number has not reached the maximum value, the control circuit 120 executes a program operation of applying a program voltage to the selected word line (step S104). In the program operation, the control circuit 120 writes user data in a normal area of the page, and sets the signal VBL_DAC, which was acquired in step S101, as flag data in the redundancy area of the page.

Figure 14:
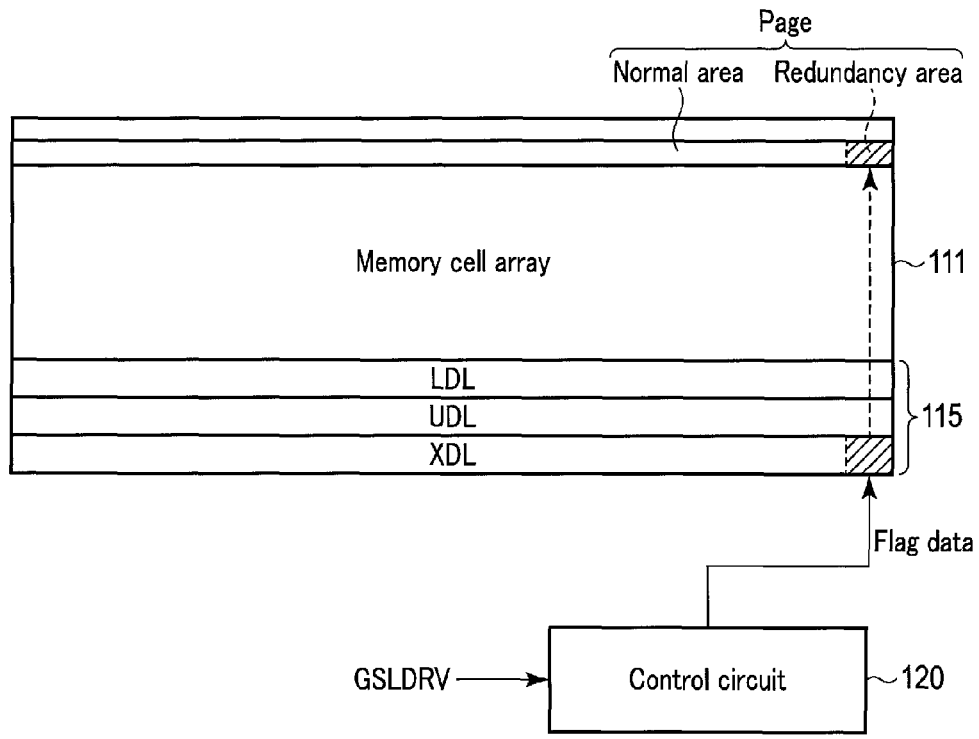
FIG. 14 is a view for explaining a redundancy area for writing flag data.

FIG. 14 is a view for explaining a redundancy area for writing flag data. A page, which is composed of a plurality of memory cell transistors connected to one word line WL, includes a normal area for storing normal data (user data), and a redundancy area. In this embodiment, flag data is stored in the redundancy area. User data, which is written together with the flag data, is stored in the normal area.

Subsequently, the control circuit 120 executes a verify operation of confirming (verifying) a threshold of the memory cell transistor (step S105). In addition, in the verify operation, the program parameter set, which was selected in step S102, is used. Further, in the verify operation, the control circuit 120 adjusts the bit line voltage by using the VBL_DAC which was acquired in step S101. Thereby, in the verify operation, a cell current iCELL, which is a target, is realized.

Following the above, the control circuit 120 determines whether verify has been passed or not (step S106). If verify is not passed, the control circuit 120 steps up the program voltage by a step-up voltage DVPGM, and executes a program loop once again (step S107). Thereafter, the application of the program voltage and the verify operation are repeated until verify is passed.

Figure 15:
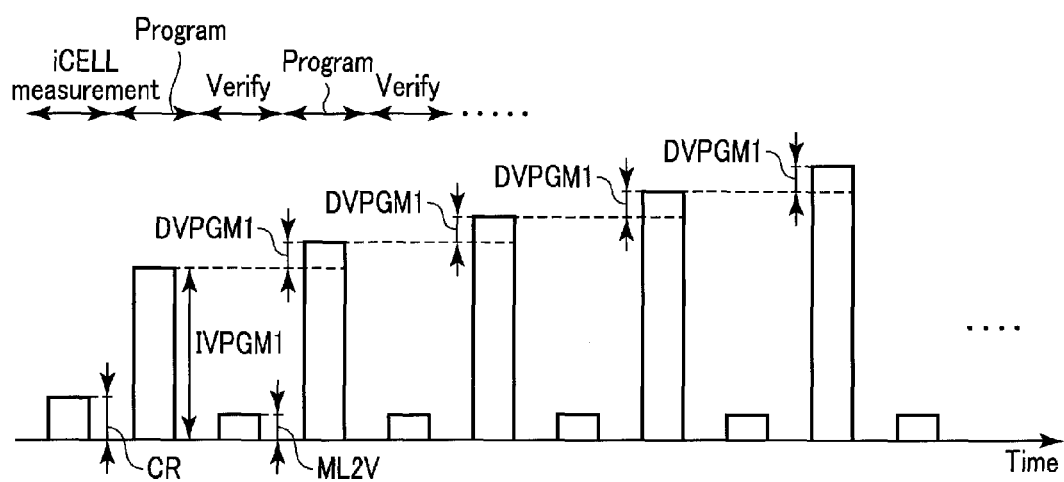
FIG. 15 illustrates a voltage waveform of a voltage which is applied to a selected word line according to the first embodiment.
Figures 16A, 16B, 16C, 16D:
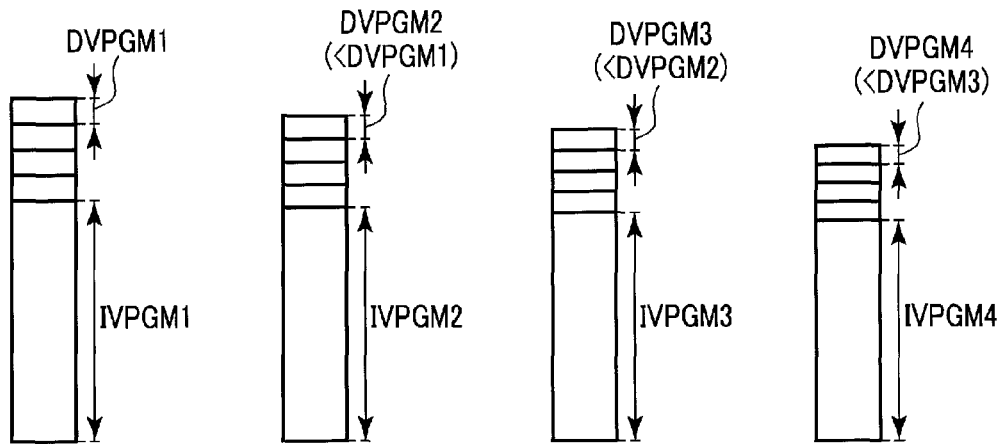
FIGS. 16A to 16D are a view for explaining an example of an initial program voltage and a step-up voltage included in first to fourth program parameter sets.

FIG. 15 illustrates a voltage waveform of a voltage which is applied to a selected word line. An initial program voltage and a step-up voltage, which are included in the first program parameter set, are denoted by IVPGM1 and DVPGM1, respectively. In the lower page program, the verify operation is executed by using a verify level ML2V.

FIGS. 16A to 16D are a view for explaining an example of initial program voltages and step-up voltages included in the first to fourth program parameter sets. FIGS. 16A to 16D correspond to the first to fourth program parameter sets, respectively.

In the example of FIGS. 16A to 16D, the levels of initial program voltages IVPGM1 to IVPGM4 of the first to fourth program parameter sets become lower in the named order. In addition, the levels of step-up voltages DVPGM1 to DVPGM4 of the first to fourth program parameter sets become lower in the named order.

[1-2-4] Upper Page Program Operation

Figure 17:
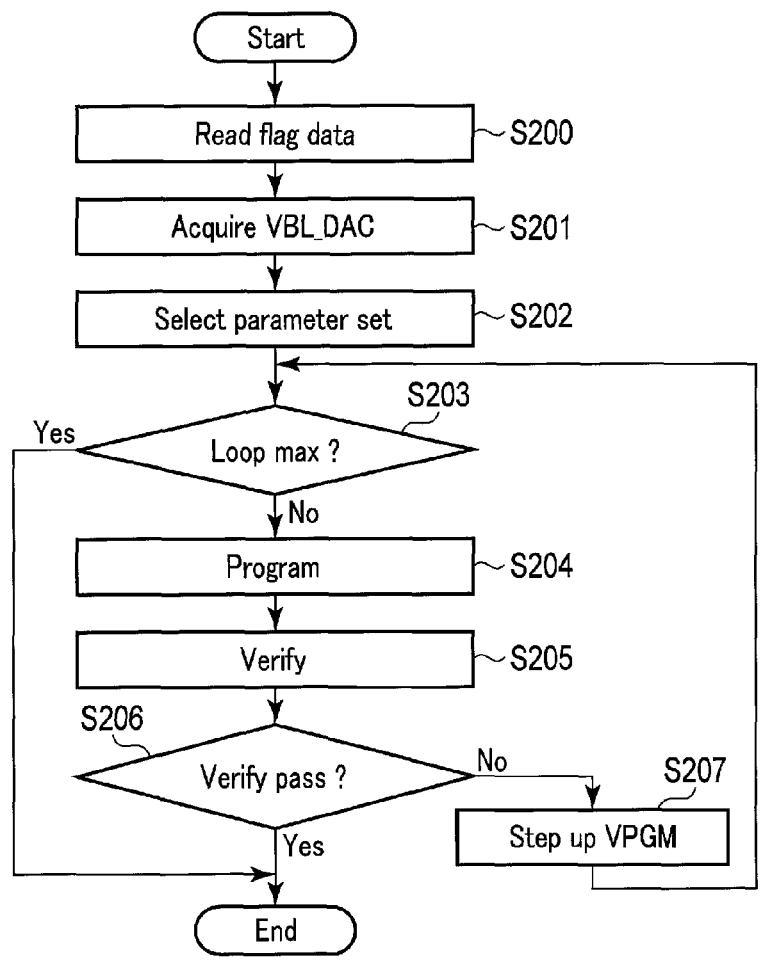
FIG. 17 is a flowchart of an upper page program operation according to the first embodiment.

Next, an upper page program operation is described. FIG. 17 is a flowchart of the upper page program operation. FIG. 18 is a timing chart of the upper page program operation. FIG. 18 illustrates waveforms of the bit line BL and source line SL.

In this embodiment, a read operation for reading flag data is included in the upper page program operation. The flag data read operation is executed in a first step of the upper page program operation.

The flag data is stored in the lower page. Thus, the control circuit 120 executes the flag data read operation by using the read level ARL for determining lower page data (step S200). Subsequently, the control circuit 120 acquires a signal VBL_DAC from the read flag data (step S201). In addition, the control circuit 120 sets the signal VBL_DAC in the redundancy area of the page as flag data.

Then, the control circuit 120 selects a program parameter set, based on the signal VBL_DAC (step S202). The selection of the program parameter set is executed as illustrated in FIG. 10 (or FIG. 11).

Subsequently, the control circuit 120 determines whether the program loop number has reached a maximum value or not (step S203). If the program loop number has not reached the maximum value, the control circuit 120 executes a program operation of the upper page (step S204). In the upper page program, program operations of "A" level, "B" level and "C" level are successively executed.

In the program operation, the control circuit 120 sets the flag data, which was read in step S200, in the data cache UDL, and writes the flag data in the redundancy area as the upper page. Specifically, the flag data of the upper page becomes identical to the flag data of the lower page. Thereby, the flag data after the program of the upper page becomes "11" data or "00" data. In this manner, since the threshold distributions of the two-value data do not neighbor each other, it becomes possible to suppress a change of data due to a threshold variation of the memory cell transistor MT. The subsequent operation is the same as in the case of the lower page program.

[1-2-5] Read Operation

Next, a read operation is described. FIG. 19 is a timing chart of the read operation. In the read operation of the present embodiment, two read operations, namely first read for reading flag data and second read for reading normal data, are executed.

For example, upon receiving a read command, the control circuit 120 outputs a busy signal. Subsequently, the control circuit 120 executes the first read operation for flag data. The read operation of flag data is the same as, for example, the flag data read operation (step S200) of FIG. 17.

Following the above, the control circuit 120 executes the second read operation for reading normal data. In the second read operation, the control circuit 120 executes an adjustment operation of a bit line voltage. Thereby, in the second read operation, a cell current iCELL that is a target is realized. Further, the control circuit 120 selects a read parameter set, based on flag data, and executes the second read operation by using the read parameter set. A read operation, which corresponds to the degree of degradation of the memory cell array, can be realized.

In the meantime, the erase parameter set, like the program parameter set, is selected based on the signal VBL_DAC. In the case of the erase operation, like the read operation of FIG. 19, flag data is read in the first step prior to the erase operation. The erase parameter set includes an initial erase voltage IVERA and a step-up voltage DVERA. In addition, a voltage, which is applied to the word line at the time of erase, may be varied.

[1-3] Example of Application to Multi-Stacked Memory Cell Array

In a multi-stacked memory cell array, the diameter of a semiconductor layer, in which channels are formed, is different between a lower part and an upper part of the NAND string. It is thus possible that operational characteristics are different between a memory cell transistor included in the lower part of the NAND string and a memory cell transistor included in the upper part of the NAND string. To cope with this, the NAND string is divided into some areas and managed, thereby varying operation parameters on an area-by-area basis.

Figure 20:
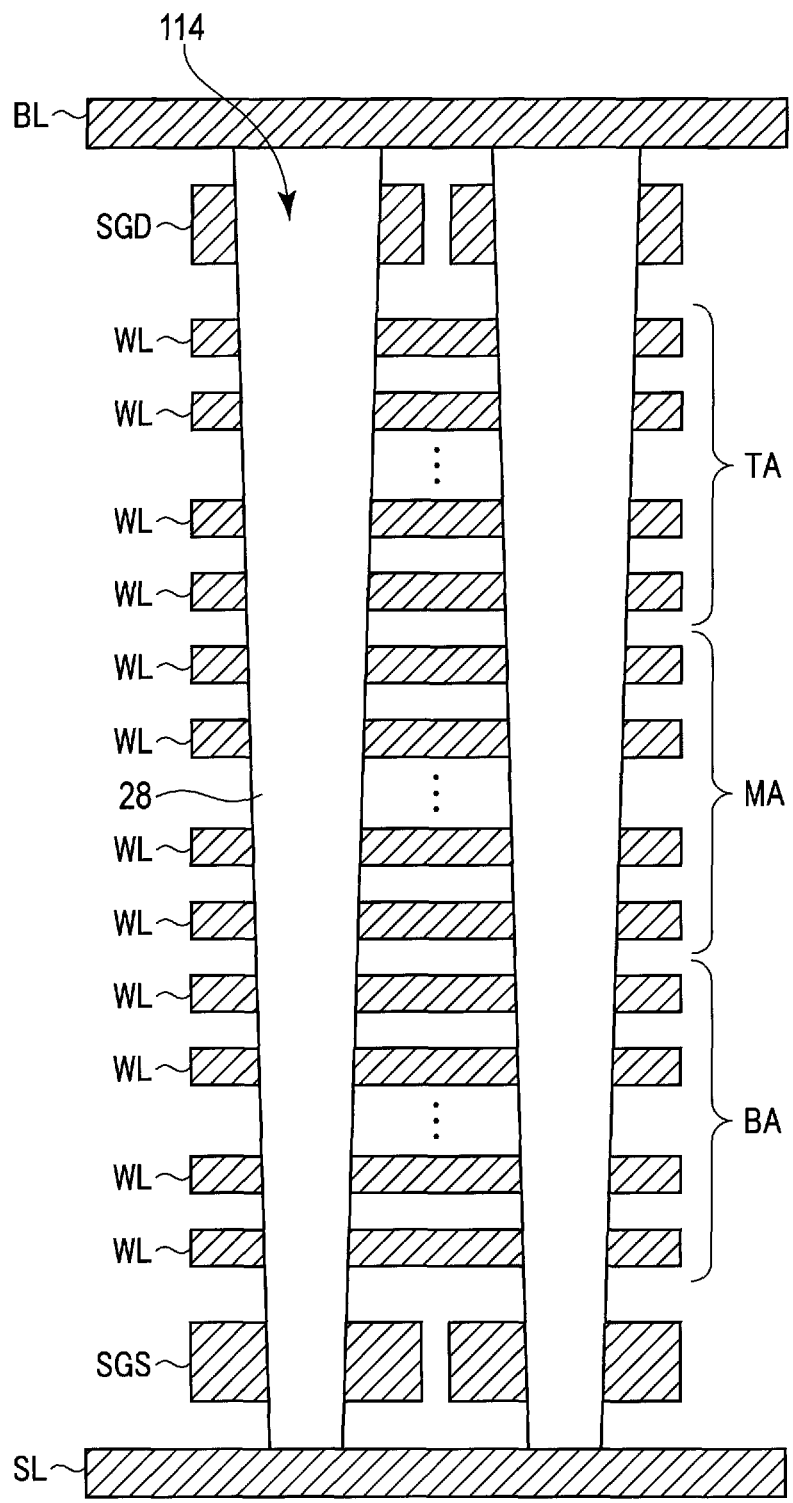
FIG. 20 is a cross-sectional view for explaining areas of a NAND string.

FIG. 20 is a cross-sectional view for explaining areas of a NAND string. The NAND string 114 is composed of a bottom area BA, a middle area MA and a top area TA. Incidentally, the number of divided areas is merely an example, and may arbitrarily be set. In addition, the number of word lines included in each area (the number of memory cell transistors) is also arbitrarily settable.

Next, the erase parameter set, which is used at the time of the erase operation, is described. FIG. 21 is a view illustrating the relationship between the signal VBL_DAC and erase parameter sets.

As illustrated in FIG. 21, erase parameter sets are prepared for the bottom area BA, middle area MA and top area TA, respectively.

In the refresh state, first to third erase parameter sets are used for the bottom area BA, middle area MA and top area TA, respectively. In the first erase parameter set, the erase voltage VERA is 20 V, and the word line voltage at the time of erase is 0.2 V. The voltages included in the second to 12th erase parameter sets are as illustrated in FIG. 21.

In this manner, by changing the operation parameter sets in accordance with the bottom area BA, middle area MA and top area TA, more optimal operations corresponding to the respective areas can be realized.

In addition, like the erase parameters, the program parameters (including verify parameters) and read parameters can be set for the bottom area BA, middle area MA and top area TA, respectively.

In the meantime, the operation parameter sets (program parameter sets, read parameter sets and erase parameter sets) may be set more finely than in FIG. 20, and may be set, for example, on a word line by word line basis.

[1-4] Advantageous Effects

As has been described above in detail, in the first embodiment, in the lower page program operation, the cell current measuring operation is executed. In addition, based on the signal VBL_DAC acquired in the cell current measuring operation, the optimal program parameter sets are selected. Thereby, a more optimal program operation and a more optimal verify operation can be realized in accordance with the degree of degradation of the memory cell array. Specifically, sharper threshold distributions can be set.

Additionally, also in the read operation and erase operation, the same advantageous effects as in the program operation can be obtained. Thereby, a NAND flash memory 100 with high data reliability can be realized.

Additionally, in the present embodiment, by controlling the signal VBL_DAC in accordance with the degree of degradation of the memory cell array, the cell current iCELL flowing in the NAND string can be kept substantially constant, regardless of the number of times of write/erase (W/E number). Thereby, the power consumption of the NAND flash memory 100 can be reduced.

Additionally, the operation parameter sets are changed in association with the areas (e.g. bottom area BA, middle area MA and top area TA) of the multi-stacked memory cell array. Thereby, in the NAND flash memory 100 to which the multi-stacked memory cell array is applied, the data reliability can be further enhanced.

Second Embodiment

In a second embodiment, after a bit number of specific data, which is to be written to a sampling area of the page, is counted, a first count value, which was counted, is stored in a redundancy area of the page. Subsequently, when data has been read from the page, the bit number of the specific data in the sampling area is counted, and a second count value is acquired. Then, the degree of degradation of the memory cell array is determined in accordance with the difference between the first count value and second count value.

[2-1] Configuration of Memory Cell Array 111

First, the configuration of a memory cell array 111 is described. FIG. 22 is a block diagram illustrating, mainly, the memory cell array 111 according to the second embodiment.

A page, which is composed of a plurality of memory cell transistors connected to one word line WL, includes a normal area for storing normal data (user data), and a redundancy area. A sampling area is provided in an arbitrary portion of the normal area. The sampling area is used for counting, on a kind-by-kind basis, data that is to be written to the sampling area, and for counting, on a kind-by-kind basis, data which was read from this area. The redundancy area is used for storing, as flag data, the bit number of the counted data.

[2-2] Outline of Data Transfer in Read Operation

Next, the outline of data transfer in the read operation is described. FIG. 23 is a timing chart of data transfer in the read operation. FIG. 23 illustrates signals which are transferred between the memory controller 200 and NAND flash memory 100 via the NAND bus. A command latch enable signal CLE, an address latch enable signal ALE, a write enable signal WEn, a read enable signal REn, and an output signal I/O are transferred between the memory controller 200 and NAND flash memory 100.

The memory controller 200 asserts the signals CLE and WEn, and sends a read command "00h" to the NAND flash memory 100. Subsequently, the memory controller 200 asserts the signal ALE and WEn, and sends address signals A1 to A5 to the NAND flash memory 100. Following this, the memory controller 200 asserts the signals CLE and WEn, and sends a read execution command "30h" to the NAND flash memory 100. On the other hand, the NAND flash memory 100 responds to the signals CLE, ALE and WEn, and receives the commands and addresses.

Subsequently, the memory controller 200 asserts the signal REn, and the NAND flash memory 100 responds to the signal REn and sends data D0, D2, D3, . . . , to the memory controller 200. Meanwhile, the memory controller 200 receives the data from the NAND flash memory 100.

In the above manner, data is transferred between the memory controller 200 and the NAND flash memory 100. In the description below, although the signals CLE, ALE, WEn and REn are omitted, FIG. 23 is to be referred to in connection with the timings of these signals.

[2-3] Program Operation

Next, a program operation is described.

[2-3-1] Lower Page Program Operation

Figure 24:
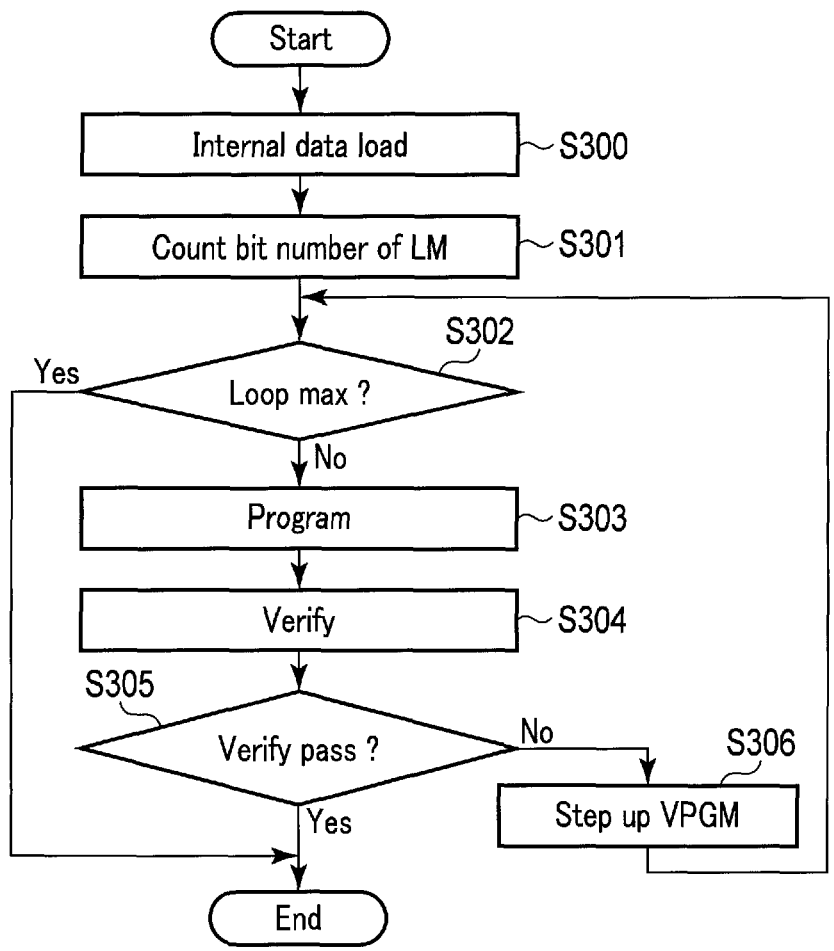
FIG. 24 is a flowchart of a lower page program operation according to the second embodiment.

First, a lower page program operation is described. FIG. 24 is a flowchart of the lower page program operation.

The control circuit 120 loads data (lower page data), which the input/output circuit 119 received, in the page buffer 115 (step S300). Specifically, the control circuit 120 stores the data, which was sent from the input/output circuit 119, in the data cache XDL, and transfers the data from the data cache XDL to the data cache LDL.

Subsequently, using the data stored in the data cache, the control circuit 120 counts the bit number of "LM" level of the data written to the sampling area (step S301). The threshold distribution of "LM" level corresponds to data "0". Thereby, the number of memory cells, which are programmed to "LM" level (data "0"), is calculated. In addition, the control circuit 120 sets the count value as flag data in the redundancy area of the selected page.

Then, the control circuit 120 determines whether or not the program loop number has reached the maximum value (step S302). If the program loop number has not reached the maximum value, the control circuit 120 executes a program operation on the selected page (step S303).

Subsequently, the control circuit 120 executes a verify operation (step S304). Then, the control circuit 120 determines whether verify has been passed or not (step S305). If verify has not been passed, the control circuit 120 steps up the program voltage by the step-up voltage DVPGM, and executes the program loop once again (step S306).

By this operation, the number of memory cells, which are to be set in the threshold distribution of "LM" level, among the memory cells included in the sampling area, is written as flag data to the redundancy area. Incidentally, the bit number of "E" level of the data written to the sampling area may be counted. In this case, the number of memory cells, which are to be set in the threshold distribution of "E" level, among the memory cells included in the sampling area, is written as flag data to the redundancy area. Then, the count value of memory cells of "E" level is used in order to determine the degree of degradation of the memory cell array.

[2-3-2] Upper Page Program Operation

Figure 25:
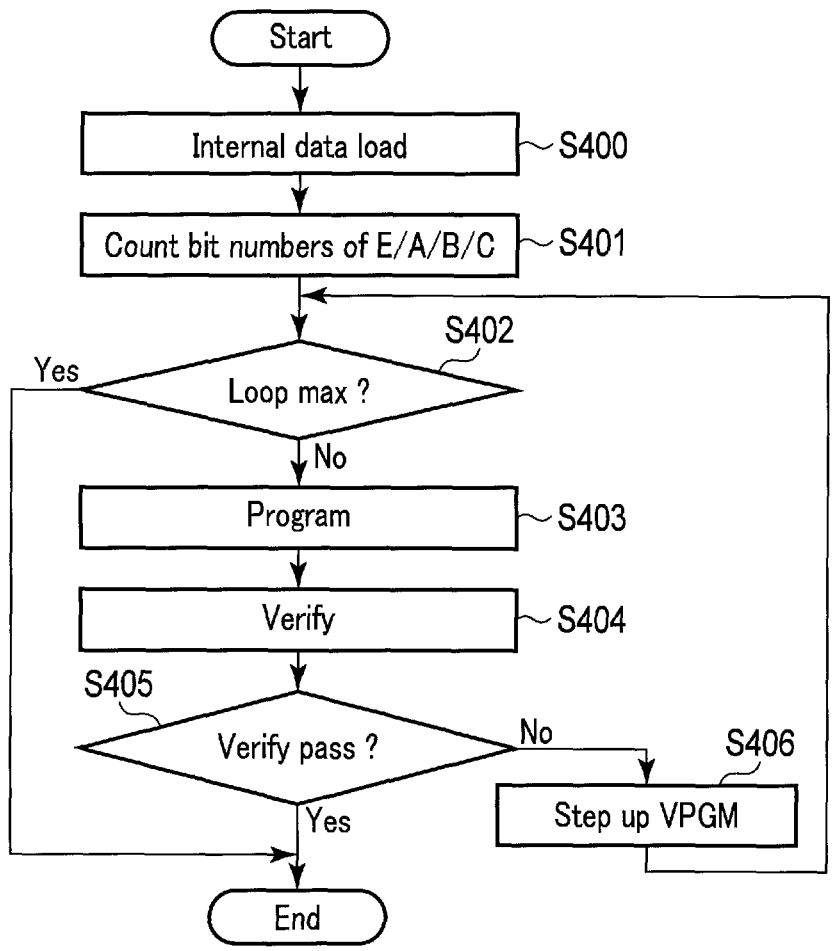
FIG. 25 is a flowchart of an upper page program operation according to the second embodiment.

Next, an upper page program operation is described. FIG. 25 is a flowchart of the upper page program operation.

The control circuit 120 loads data (upper page data), which the input/output circuit 119 received, in the page buffer 115 (step S400). Specifically, the control circuit 120 stores the data, which was sent from the input/output circuit 119, in the data cache XDL, and transfers the data from the data cache XDL to the data cache UDL. Lower page data, which is necessary for upper page program, is read from the memory cell array in advance, and stored in the data cache LDL.

Subsequently, using the data stored in the data cache, the control circuit 120 counts the bit numbers of "E" level, "A" level, "B" level and "C" level (step S401). In addition, the control circuit 120 sets the count values as flag data in the redundancy area of the selected page.

Then, the control circuit 120 determines whether or not the program loop number has reached the maximum value (step S402). If the program loop number has not reached the maximum value, the control circuit 120 executes a program operation on the selected page (step S403).

Subsequently, the control circuit 120 executes a verify operation (step S404). Then, the control circuit 120 determines whether verify has been passed or not (step S405). If verify has not been passed, the control circuit 120 steps up the program voltage by the step-up voltage DVPGM, and executes the program loop once again (step S406). Incidentally, the program operation of step S403 and the verify operation of step S404 include program operations and verify operations of "A" level, "B" level and "C" level.

By this operation, the bit numbers of "E" level, "A" level, "B" level and "C" level of the memory cells included in the sampling area are written as flag data to the redundancy area. In the meantime, there is no need to count the bit numbers of all levels and write the count results to the redundancy area. It is possible to adopt such a method as counting only "E" level and estimating, based on this, the degree of degradation of the other levels.

[2-4] Read Operation

Next, a read operation is described.

[2-4-1] Example 1

Figure 26:
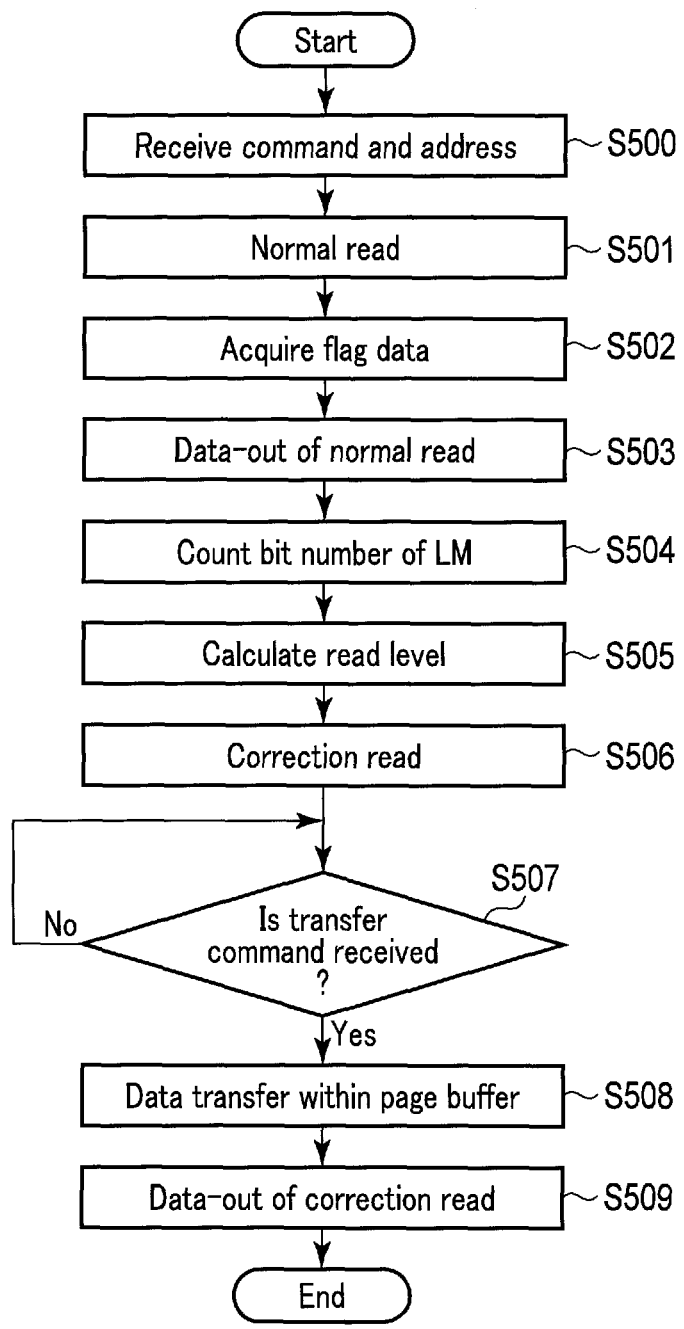
FIG. 26 is a flowchart of a lower page read operation according to Example 1.

First, a lower page read operation is described. FIG. 26 is a flowchart of the lower page read operation according to Example 1. FIG. 27 is a timing chart of the lower page read operation according to Example 1.

The control circuit 120 receives a prefix command Prefix-CMD1, a read command "00h", address signals A1 to A5, and a read execution command "30h" from the memory controller 200 (step S500). By first issuing the prefix command Prefix-CMD1, a special read mode, which is different from a mode of a normal read command, can be designated. Responding to this, the control circuit 120 sends a busy signal to the memory controller 200.

Subsequently, the control circuit 120 executes a normal read operation (step S501). FIG. 28 illustrates voltage waveforms in read operations. In FIG. 28, SGD_SEL and SGS_SEL are select gate lines included in a selected string unit, and SGD_USEL and SGS_USEL are select gate lines included in a non-selected string unit. WL_SEL is a selected word line, and WL_USEL is non-selected word lines.

In a normal read operation, the row decoder 112 applies a voltage Vsg to the select gate lines SGD_SEL and SGS_SEL in the selected string unit, and turns on the select transistors ST1 and ST2. In addition, the row decoder 112 applies a read voltage Vcgrv to the selected word line WL_SEL, and applies a voltage VREAD to the non-selected word lines WL_USEL. Further, the row decoder 112 applies a voltage VSS (0 V) to the select gate lines SGD_USEL and SGS_USEL in the non-selected string unit, and turns off the select transistors ST1 and ST2. Incidentally, in the case of lower page read, the read voltage Vcgrv corresponds to the level BR which can determine "1" and "0" of lower data.

In the normal read operation, flag data stored in the redundancy area is read, and the control circuit 120 acquires the flag data (step S502). Then, using the flag data, the control circuit 120 calculates the bit number of "LM" level at the time of program. Subsequently, the control circuit 120 transfers the data, which was read in the normal read operation, from the sense amplifier SA to the data cache XDL. Thereby, data-out of normal read becomes possible, and the control circuit 120 sends a ready signal (cache ready) to the memory controller 200 (step S503).

Then, using the read data stored in the data cache UDL, the control circuit 120 counts the bit number of "LM" level in the sampling area (step S504). Subsequently, the control circuit 120 compares an expected value, which was calculated from the flag data of step S502, and a read result of step S504. Then, the control circuit 120 calculates a read level, based on the comparison result (step S505). In a method of adjusting the read level, for example, as described in the first embodiment, a plurality of read parameter sets are stored in the register 122, and any one of the read parameter sets is selected in accordance with the magnitude of the comparison result.

Subsequently, using the adjusted read level, the control circuit 120 executes a correction read operation (step S506). Specifically, as illustrated in FIG. 28, the read operation is executed by adjusting the read voltage Vcgrv by a voltage Δ. Then, the control circuit 120 transfers the data, which was read in the correction read operation, from the sense amplifier SA to the data cache LDL. Thereafter, the control circuit 120 sends a ready signal (true ready) to the memory controller 200.

Then, the memory controller 200 sends a status read command "70h" to the NAND flash memory 100. Responding to the status read command "70h", the NAND flash memory 100 sends a status to the memory controller 200. By this status, the memory controller 200 can obtain information of correction read.

Subsequently, the control circuit 120 monitors whether a transfer command "3Fh" has been received from the memory controller 200 (step S507). If the transfer command "3Fh" has been received, the control circuit 120 transfers the data from the data cache LDL to the data cache XDL (step S508). Thereafter, the control circuit 120 becomes able to execute data-out of correction read, and the control circuit 120 sends a ready signal (true ready) to the memory controller 200 (step S509).

In the meantime, in step S507, when the transfer command "3Fh" is not received from the memory controller 200, that is, when the normal read ended normally, the data-out of correction read is not executed.

<Upper Page Read Operation>

Next, an upper page read operation is described. FIG. 29 is a flowchart of the upper page read operation.

In the upper page read operation, the control circuit 120 calculates the bit numbers of "E" level, "A" level, "B" level and "C" level, by using the flag data acquired in step S602.

In addition, the control circuit 120 counts the bit numbers of "E" level, "A" level, "B" level and "C" level in the sampling area, by using the read data stored in the data cache XDL (step S604). Thereafter, the control circuit 120 calculates a read level, based on the comparison result (step S605).

The operation other than the above is the same as the above-described upper page read operation. Thereby, a more precise read operation of the upper page can be realized.

<Example of Correction Value of Read Level>

Next, an example of the correction value of the read level is described. FIG. 30 is a view illustrating the relationship between a difference between flag data and a count value, on one hand, and read levels, on the other hand.

As is understood from FIG. 5, the read level AR is used in order to determine the "E" level, and the "A", "B" and "C" levels. The read level BR is used in order to determine the "LM" level in the lower page program. The read level CR is used in order to determine the "E", "A" and "B" levels, and the "C" level. Specifically, the read level BR is used in the lower page read operation, and the read levels AR and CR are used in the upper page read operation.

As illustrated in FIG. 30, as regards the read level AR, if the difference in number of "E" cells is negative (the flag data is smaller), there are a large number of memory cells whose thresholds lowered to "E" level from "A", "B" and "C" levels. It is thus necessary to lower the read level AR.

As regards the read level BR, if the difference in number of "LM" cells is negative (the flag data is smaller), there are a large number of memory cells whose thresholds rose to "LM" level. In this case, the read level BR needs to be raised.

As regards the read level CR, if the difference in number of "C" cells is negative (the flag data is smaller), there are a large number of memory cells whose thresholds rose to "C" level from from "E", "A" and "B" levels. In this case, the read level AR needs to be raised.

By adjusting the read level as illustrated in FIG. 30, a more precise read operation can be realized in accordance with the degree of degradation of the memory cell array.

Incidentally, like the first embodiment, when the multi-stacked memory cell array is adopted, correction values may be set for the bottom area BA, middle area MA and top area TA, respectively. Furthermore, the correction value may be set on a word line by word line basis.

[2-4-2] Example 2

Next, a read operation according to Example 2 is described. FIG. 31 is a timing chart of the read operation according to Example 2. FIG. 31 is common to a lower page read operation and an upper page read operation.

The control circuit 120 receives a prefix command Prefix-CMD2, a read command "00h", address signals A1 to A5, and a read execution command "30h" from the memory controller 200. By the prefix command Prefix-CMD2, a read mode, which is different from Example 1, can be designated.

Subsequently, the control circuit 120 successively executes a normal read operation and a correction read operation. The normal read operation and correction read operation are the same as in Example 1. Subsequently, the control circuit 120 outputs data, which was read by the correction read operation, to the memory controller 200.

The read operation according to Example 2 is particularly effective, for example, when page data are successively read. Specifically, when it can be determined that the memory cell array deteriorates to some degree in a previous read operation, read data based on correction read is requested from the beginning. Thereby, the read operation can be made simpler than in Example 1.

[2-4-3] Example 3

Next, a read operation according to Example 3 is described. FIG. 32 is a flowchart of a lower page read operation according to Example 3. FIG. 33 illustrates voltage waveforms in the lower page read operation according to Example 3. The timing chart of the read operation is the same as FIG. 31.

The control circuit 120 receives a prefix command Prefix-CMD2, a read command "00h", address signals A1 to A5, and a read execution command "30h" from the memory controller 200 (step S700). Responding to this, the control circuit 120 sends a busy signal to the memory controller 200.

Subsequently, the control circuit 120 executes a normal read operation (step S701). In the normal read operation, the flag data stored in the redundancy area of the selected page is read, and the control circuit 120 acquires the flag data (step S702). Then, by using the flag data, the control circuit 120 calculates the bit number of "LM" level at a time of program.

Following the above, using the read data stored in the data cache XDL, the control circuit 120 counts the bit number of "LM" level in the sampling area (step S703). Then, the control circuit 120 compares an expected value, which was calculated from the flag data of step S702, and a read result of step S703, and determines that read has been passed, if the difference between the read result and the expected value falls within an allowable value (step S704). Thereafter, the control circuit 120 executes data-out of normal read.

On the other hand, if read is not passed in step S704, the control circuit 120 calculates a read level, based on the comparison result (step S705). In the example of FIG. 33, a read level "Vcgrv+Δ1", in which a step-up voltage Δ1 is added to a normal read level Vcgrv, is calculated.

Subsequently, the control circuit 120 determines whether the read loop number has reached a maximum value or not (step S706). If the read loop number has not reached the maximum value, the control circuit 120 executes a correction read operation by using the read level "Vcgrv+Δ1" (step S707).

Then, the control circuit 120 counts the bit number of "LM" level in the sampling area included in the data that was read by the correction read (step S708). Subsequently, the control circuit 120 compares the expected value, which was calculated from the flag data of step S702, and a read result of step S708. Then, the control circuit 120 determines that read has been passed, if the read result and expected value become equal, or the difference between the read result and the expected value falls within an allowable value (step S709). Subsequently, the control circuit 120 outputs to the memory controller 200 the data read by the correction read operation (the data stored in the data cache XDL).

On the other hand, if the read fails to be passed in step S709, the control circuit 120 steps up the read level by voltage Δ1 (step S710), and repeats the correction read operation. In addition, if the read loop number has reached the maximum value in step S706, the control circuit 120 outputs the latest read data to the memory controller 200.

Incidentally, as regards the upper page read operation, the flow chart of FIG. 32 can be referred to, except that the calculation of the "LM" level of the lower page read operation is executed at each of the the "E" level, "A" level, "B" level and "C" level.

[2-5] Advantageous Effects

As has been described above in detail, according to the second embodiment, the NAND flash memory 100 can output data with higher reliability to the memory controller 200. Conventionally, the memory controller 200 repeats a sequence of executing error correction of a read result from the NAND flash memory 100, and executing re-read in a case of correction NG by varying the read level. If this sequent is used, the read time increases. However, in the present embodiment, data with higher reliability can be output to the memory controller 200, and the read time can be reduced.

In addition, the read level is adjusted in accordance with the difference between the flag data and the read result. Thereby, a more optimal read operation can be realized in accordance with degree of degradation of the memory cell array. As a result, the NAND flash memory 100 with high data reliability can be realized. As regards the upper page, the same advantageous effects as with the lower page can be obtained.

Furthermore, in accordance with the instruction from the memory controller 200, either the read data by normal read that is the first read, or the read data by correction read that is the second and subsequent read, can selectively be sent to the memory controller 200. Thereby, the NAND flash memory 100, which can output data that is suited to the demand of the memory controller 200, can be realized.

Third Embodiment

In the second embodiment, bit count is executed in the NAND flash memory 100, and write time increases by a degree corresponding to the bit count operation. In a third embodiment, bit count is executed by the memory controller 200, and management of flag data is executed by the NAND flash memory 100.

[3-1] Write Operation

Figure 35:
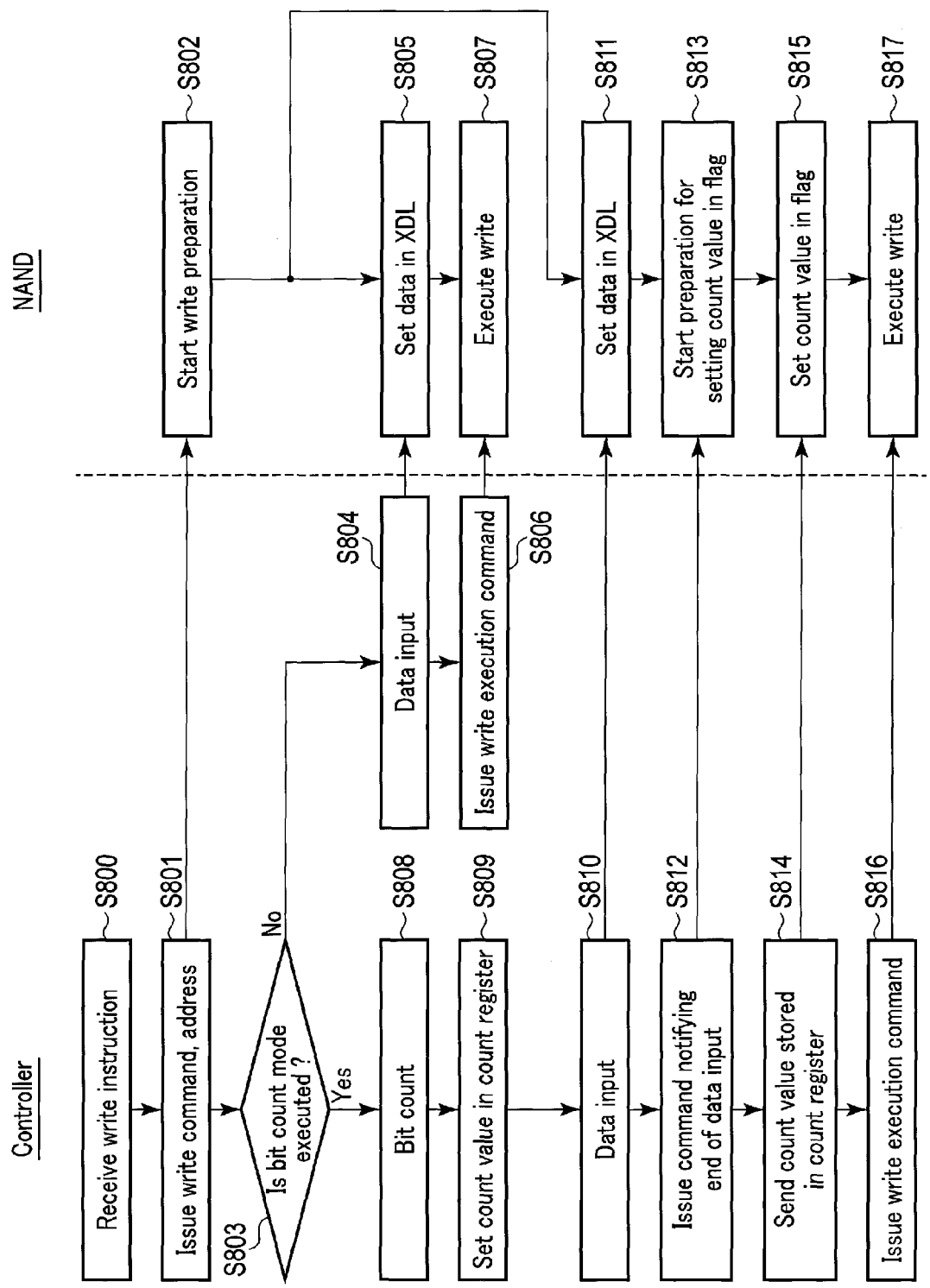
FIG. 35 is a flowchart illustrating the write operation of the memory controller and NAND flash memory according to the third embodiment.

A write operation according to the third embodiment is described. FIG. 34 is a timing chart illustrating a write operation of the memory controller 200 and NAND flash memory 100 according to the third embodiment. FIG. 35 is a flowchart illustrating the write operation of the memory controller 200 and NAND flash memory 100.

First, the memory controller 200 receives a write instruction from the host device 400 (step S800). Subsequently, responding to the write instruction from the host device 400, the memory controller 200 issues a write command "80" and an address to the NAND flash memory 100 (step S801). Responding to the write command from the memory controller 200, the NAND flash memory 100 starts write preparation (S802).

Then, the memory controller 200 determines whether or not to execute a bit count mode for comparing the bit number of data written to the sampling area and the expected value (step S803). When the bit count mode is not executed, the memory controller 200 executes a normal write operation. Specifically, the memory controller 200 inputs data to the NAND flash memory 100 (step S804). Responding to this, the NAND flash memory 100 sets the data in the data cache XDL (step S805). Subsequently, the memory controller 200 issues a write execution command "15/10" to the NAND flash memory 100 (step S806). Responding to this, the NAND flash memory 100 executes write (step S807).

If the bit count mode is executed in step S803, the memory controller 200 counts the bit number of a corresponding write level of the data written to the sampling area (step S808). Specifically, in the case of lower page program, the bit number of "LM" level (or "E" level) is counted. In the case of upper page program, the bit number of each of "E" level, "A" level, "B" level and "C" level is counted. The bit count operation is the same as in the second embodiment. Subsequently, the memory controller 200 sets the count value in step S808 in a count register (step S809). The count register may be constituted by using a part of the RAM 240, or a dedicated register may be prepared.

Subsequently, the memory controller 200 inputs data to the NAND flash memory 100 (step S810). Responding to this, the NAND flash memory 100 sets the data in the data cache XDL (step S811). Then, the memory controller 200 issues to the NAND flash memory 100 a command "1X" notifying the end of data input (step S812). Responding to the command "1X", the NAND flash memory 100 starts preparation for setting the count value in the flag (step S813). Specifically, the NAND flash memory 100 transfers the data of the data cache XDL to the data cache UDL ("X2U" in FIG. 34).

Subsequently, the memory controller 200 sends the count value (CNT result), which is stored in the count register, to the NAND flash memory 100 (step S814). Then, the NAND flash memory 100 sets the count value in the flag (step S815).

Following the above, the memory controller 200 issues a write execution command "15/10" to the NAND flash memory 100 (step S816). Responding to this, the NAND flash memory 100 executes write (step S817). Specifically, as illustrated in FIG. 34, write (program) and verify (pvfy) are repeated. Thereby, the flag data corresponding to the count value is written to the redundancy area of the selected page.

[3-2] Read Operation

Figure 36:
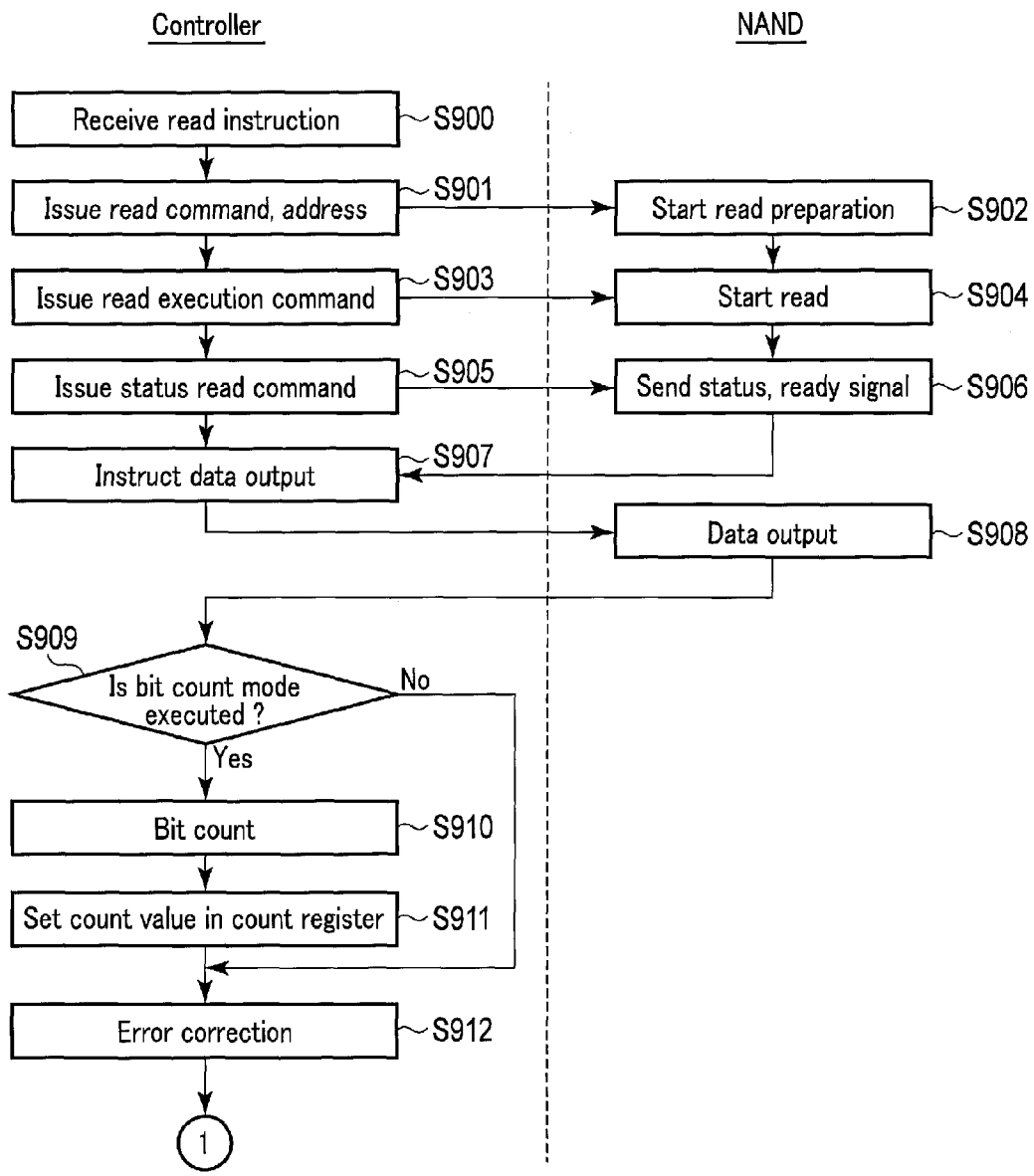
FIG. 36 is a flowchart illustrating a read operation of the memory controller and NAND flash memory according to the third embodiment.
Figure 37:
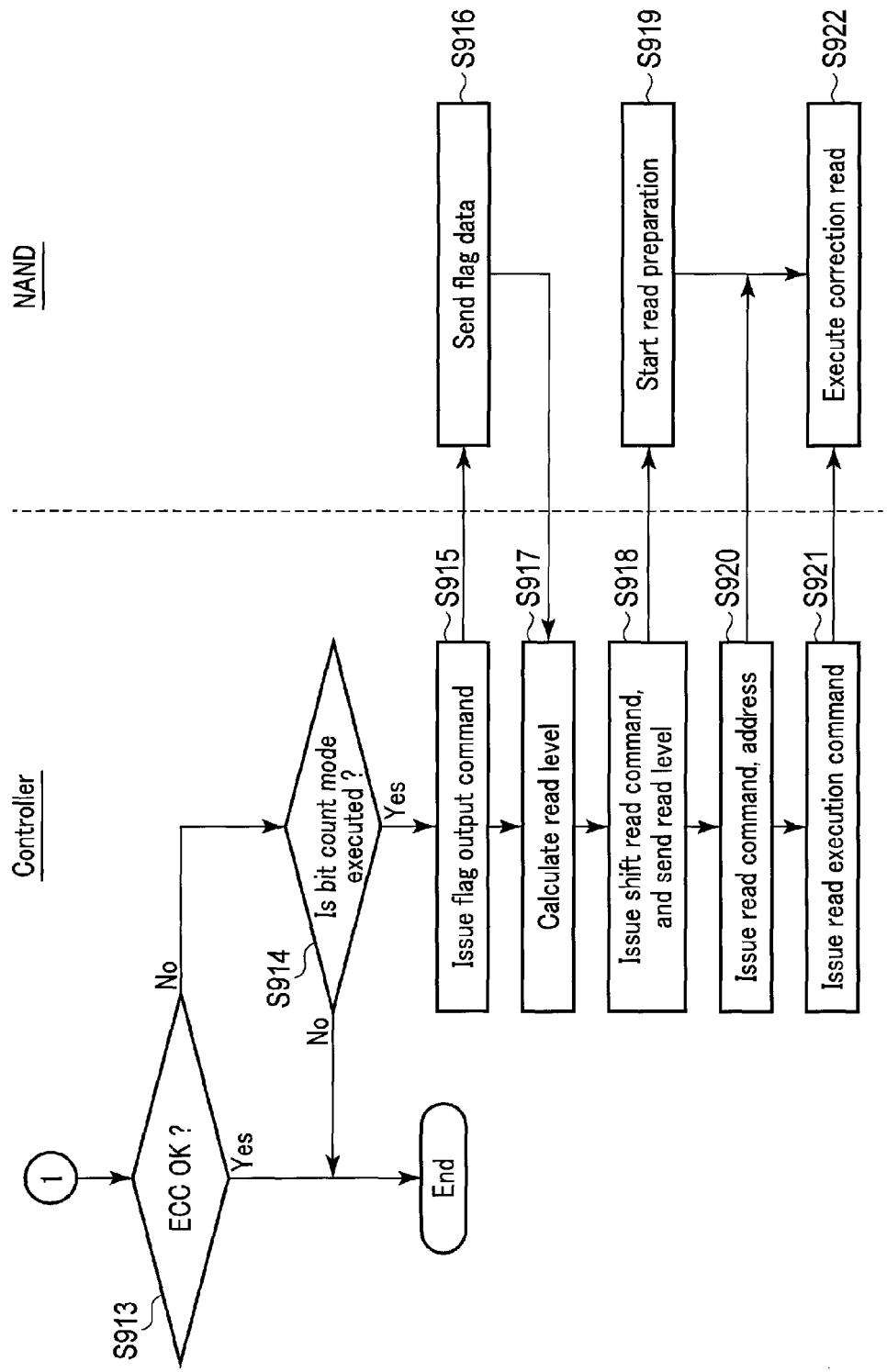
FIG. 37 is a flowchart illustrating a read operation following the read operation in FIG. 36.

Next, a read operation according to the third embodiment is described. FIG. 36 and FIG. 37 are flowcharts illustrating the read operation of the memory controller 200 and NAND flash memory 100.

First, the memory controller 200 receives a read instruction from the host device 400 (step S900). Then, responding to the read instruction from the host device 400, the memory controller 200 issues a read command and an address to the NAND flash memory 100 (step S901). Responding to the read command from the memory controller 200, the NAND flash memory 100 starts read preparation (step S902).

Subsequently, the memory controller 200 issues a read execution command to the NAND flash memory 100 (step S903). Responding to the read execution command, the NAND flash memory 100 starts read (step S904).

Following the above, the memory controller 200 issues a status read command to the NAND flash memory (step S905). Responding to the status read command, the NAND flash memory 100 sends a status relating to read data to the memory controller 200, and sends a ready signal to the memory controller 200 (step S906).

Subsequently, the memory controller 200 instructs data output (step S907). Responding to this instruction, the NAND flash memory 100 outputs data to the memory controller 200 (step S908).

Then, the memory controller 200 determines whether or not to execute the bit count mode (step S909). When the bit count mode is not executed, the error correction of the read data is executed, and the read operation ends.

If the bit count mode is executed in step S909, the memory controller 200 counts, with use of the read data, the bit number of a corresponding level of the data of the sampling area (step S910). The bit count operation is the same as in the second embodiment. Then, the memory controller 200 sets the count value of step S910 in the count register (step S911).

Subsequently, the ECC circuit 250 executes error correction of the read data (step S912). If the error correction was normally executed (step S913), the read operation ends. On the other hand, if the error correction was not normally executed, the memory controller 200 issues, through step S914, a flag output command, which instructs output of flag data, to the NAND flash memory 100 (step S915). Responding to the flag output command, the NAND flash memory 100 sends flag data to the memory controller 200 (step S916). Then, the memory controller 200 compares the flag data and the count value stored in the count register, and calculates the read level, based on the comparison result (step S917).

Following the above, the memory controller 200 issues a shift read command, which instructs correction read (instructs a read level from the outside), to the NAND flash memory 100, and sends the read level in step S917 to the NAND flash memory 100 (step S918). Responding to the shift read command from the memory controller 200, the NAND flash memory 100 starts read preparation (step S919).

Subsequently, the memory controller 20 issues a read command and an address to the NAND flash memory 100 (step S920). Then, the memory controller 200 issues a read execution command to the NAND flash memory 100 (step S921). Thereafter, the NAND flash memory 100 executes correction read (step S922). The correction read operation is the same as in the second embodiment.

[3-3] Advantageous Effects

According to the third embodiment, the bit count operation can be executed in the memory controller 200, and the count result can be managed in the NAND flash memory 100. Thereby, since the NAND flash memory 100 does not need to include a counter for the bit count operation, the circuit size of the NAND flash memory 100 can be reduced, and the processing load of the NAND flash memory 100 can be decreased. Furthermore, the write time of the NAND flash memory 100 can be decreased. The other advantageous effects are the same as in the second embodiment.

Fourth Embodiment

A fourth embodiment is a modification of the third embodiment. In the fourth embodiment, the memory controller 200 executes bit count, and management of flag data.

[4-1] Write Operation

A write operation according to the fourth embodiment is described. FIG. 38 is a timing chart illustrating a write operation of the memory controller 200 and NAND flash memory 100 according to the fourth embodiment. FIG. 39 is a flowchart illustrating the write operation of the memory controller 200 and NAND flash memory 100.

Steps S1000 to S1002 of FIG. 39 are identical to steps S800 to S802 of FIG. 35. Then, the memory controller 200 determines whether or not to execute the bit count mode (step S1003). When the bit count mode is not executed, the memory controller 200 executes a normal write process. Specifically, the memory controller 200 inputs data to the NAND flash memory 100 (step S1007). Responding to this, the NAND flash memory 100 sets the data in the data cache XDL (step S1008). Subsequently, the memory controller 200 issues a write execution command "15/10" to the NAND flash memory 100 (step S1009). Responding to this, the NAND flash memory 100 executes write (step S1010).

If the bit count mode is executed in step S1003, the memory controller 200 counts the bit number of a corresponding write level of the data written to the sampling area (step S1004). Subsequently, the memory controller 200 sets the count value in step S1004 in the count register (step S1005).

Then, the memory controller 200 associates the write level and count value and stores the associated write level and count value in the RAM 240 (step S1006). Subsequently, the above-described steps S1007 to S1010 are executed.

[4-2] Read Operation

Next, a read operation according to the fourth embodiment is described. FIG. 40 is a flowchart illustrating the read operation of the memory controller 200 and NAND flash memory 100. Steps S900 to S914 in the fourth embodiment are identical to steps S900 to S914 (FIG. 36 and FIG. 37) described in the read operation of the third embodiment. FIG. 40 shows a flowchart of step S913 or later.

If the bit count mode is executed in step S914, the memory controller 200 compares the count value, which was stored in the count register in step S911, and the count value stored in the RAM 240 in step S1006 (step S1100). Then, the memory controller 200 calculates the read level, based on the comparison result of step S1100 (step S1101).

Subsequently, the memory controller 200 issues a shift read command to the NAND flash memory 100, and sends the read level in step S1101 to the NAND flash memory 100 (step S1102). The subsequent steps S1103 to S1106 are identical to steps S919 to S922 of the third embodiment.

[4-3] Advantageous Effects

According to the fourth embodiment, the bit count operation and the management of the count result can be executed in the memory controller 200. Thereby, since the NAND flash memory 100 does not need to store the count value, the processing load of the NAND flash memory 100 can be decreased. Furthermore, the write time of the NAND flash memory 100 can be decreased. The other advantageous effects are the same as in the second embodiment.

In the embodiments according to the present invention:

(1) The voltage applied to the word line selected for the read operation at the "A"-level may be, for example, 0 V to 0.55 V. The voltage is not limited thereto, and may be 0.1 V to 0.24 V, 0.21 V to 0.31 V, 0.31 V to 0.4 V, 0.4 V to 0.5 V, or 0.5 V to 0.55 V.

The voltage applied to the word line selected for the read operation at the "B"-level is, for example, 1.5 V to 2.3 V. The voltage is not limited thereto, and may be 1.65 V to 1.8 V, 1.8 V to 1.95 V, 1.95 V to 2.1 V, or 2.1 V to 2.3 V.

The voltage applied to the word line selected for the read operation at the "C"-level is, for example, 3.0 V to 4.0 V. The voltage is not limited thereto, and may be 3.0 V to 3.2 V, 3.2 V to 3.4 V, 3.4 V to 3.5 V, 3.5 V to 3.6 V, or 3.6 V to 4.0 V.

The time (tR) for the read operation may be, for example, 25 µs to 38 µs, 38 µs to 70 µs, or 70 µs to 80 µs.

(2) The write operation includes the program operation and the verification operation as described above. In the write operation, the voltage first applied to the word line selected for the program operation may be, for example, 13.7 V to 14.3 V. The voltage is not limited thereto, and may be 13.7 V to 14.0 V or 14.0 V to 14.6 V.

The voltage first applied to the selected word line in the writing into an odd word line, and the voltage first applied to the selected word line in the writing into an even word line may be changed.

When the program operation is an incremental step pulse program (ISPP) type, a step-up voltage is, for example, about 0.5.

The voltage applied to the unselected word line may be, for example, 6.0 V to 7.3 V. The voltage is not limited thereto, and may be, for example, 7.3 V to 8.4 V or may be 6.0 V or less.

The pass voltage to be applied may be changed depending on whether the unselected word line is an odd word line or an even word line.

The time (tProg) for the write operation may be, for example, 1700 µs to 1800 µs, 1800 µs to 1900 µs, or 1900 µs to 2000 µs.

(3) In the erase operation, the voltage first applied to a well which is formed on the semiconductor substrate and over which the memory cells are arranged may be, for example, 12 V to 13.6 V. The voltage is not limited hereto, and may be, for example, 13.6 V to 14.8 V, 14.8 V to 19.0 V, 19.0 to 19.8 V, 19.8 V to 21 V.

The time (tErase) for the erase operation may be, for example, 3000 μs to 4000 μs, 4000 μs to 5000 μs, or 4000 μs to 9000 μs.

(4) The structure of the memory cell may have the charge storage layer disposed on the semiconductor substrate (silicon substrate) via a tunnel insulating film having a thickness of 4 to 10 nm. This charge storage layer may have a stacked structure including an insulating film of SiN or SiON having a thickness of 2 to 3 nm and polysilicon having a thickness of 3 to 8 nm. A metal such as Ru may be added to polysilicon. An insulating film is provided on the charge storage layer. This insulating film has, for example, a silicon oxide film having a thickness of 4 to 10 nm intervening between a lower high-k film having a thickness of 3 to 10 nm and an upper high-k film having a thickness of 3 to 10 nm. The high-k film includes, for example, HfO. The silicon oxide film can be greater in thickness than the high-k film. A control electrode having a thickness of 30 to 70 nm is formed on the insulating film via a material for work function adjustment having a thickness of 3 to 10 nm. Here, the material for work function adjustment includes a metal oxide film such as TaO or a metal nitride film such as TaN. W, for example, can be used for the control electrode.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
  a memory cell array including memory strings, one of the memory strings including memory cells;
  word lines commonly connected to the memory strings; and
  a controller configured to execute a write operation and a read operation on a page, the page being stored in memory cells connected to one of the word lines,
  wherein the controller is configured to:
    count a bit number of a first level which is to be written to a sampling area, which is a part of the page, to obtain a first count value, and write the first count value to a redundancy area of the page,
    read, in a first read, the first count value from the redundancy area, and count a bit number of the first level which was read from the sampling area, to obtain a second count value, and
    adjust, in a second read, a read voltage applied to a word line, based on a difference between the first count value and the second count value.

2. The device of claim 1, further comprising:
  a first data cache configured to store read data by the first read; and
  a second data cache configured to store read data by the second read,
  wherein the controller is configured to output either the data of the first data cache or the data of the second data cache in accordance with a command received from an outside.

3. The device of claim 1, further comprising:
  a first data cache configured to store read data by the first read; and
  a second data cache configured to store read data by the second read,
  wherein the controller is configured to
  output the data of the first data cache at a first timing, and output the data of the second data cache when a command is received from an outside at a second timing.

4. The device of claim 1, further comprising a data cache configured to store write data received from an outside,
  wherein the controller is configured to count the bit number of the first level by using the write data stored in the data cache.

5. The device of claim 1, further comprising a register configured to store parameters including information of the read voltage,
  wherein the controller is configured to:
    select one of the parameters, based on the difference the first count value and the second count value, and
    determine the read voltage by using the selected parameter.

6. The device of claim 1, wherein the controller is configured to set the read voltage in the second read to be higher than a read voltage in the first read.

7. The device of claim 1, wherein the controller is configured to step up the read voltage and repeat the read operation, when the difference between the first count value and the second count value is greater than a threshold.

8. A semiconductor memory device comprising:
  memory strings, each of the memory strings including a plurality of memory cells;
  a word line electrically connected to a plurality of first memory cells, each of the plurality of first memory cells being included in a corresponding one of the memory strings, the plurality of first memory cells being capable of storing first data and second data, the first data corresponding to a first page, the second data corresponding to a second page; and
  a controller configured to execute a write operation and a read operation on a page,
  wherein the controller is configured to:
    measure a cell current flowing in a memory string in a first write operation on the word line for writing the first data to the plurality of first memory cells, and
    adjust a write voltage applied to the word line in a second write operation for writing the second data to the plurality of first memory cells, based on a measurement result of the cell current.

9. The device of claim 8, wherein the controller is configured to:
  write the measurement result to a redundancy area of the first page,
  read the measurement result from the redundancy area in a first read, and
  adjust, in a second read, a read voltage applied to the word line, based on the measurement result.

10. The device of claim 8, wherein the controller is configured to:
  write the measurement result in a redundancy area of the first page,
  read the measurement result from the redundancy area, and
  adjust the write voltage applied to the word line, based on the measurement result.

11. The device of claim 10, wherein the write voltage is set to become smaller as the cell current becomes smaller.

12. The device of claim 10, wherein in an erase operation, the controller is configured to:
   read the measurement result from the redundancy area, and
   adjust an erase voltage, based on the measurement result.

13. The device of claim 12, wherein the erase voltage is set to become larger as the cell current becomes smaller.

14. The device of claim 8, further comprising a register configured to store parameters including information of the write voltage,
   wherein the controller is configured to:
   select one of the parameters, based on the measurement result, and
   determine the write voltage by using the selected parameter.

15. The device of claim 8, wherein the memory cells are stacked and comprise a first group and a second group which are divided along a direction of the stacking, and the controller is configured to further adjust the write voltage in accordance with the first group and the second group.

16. The device of claim 8, wherein the controller is configured to:
   write the measurement result in a redundancy area of the first page, and
   adjust a read voltage applied to the word line in the read operation, based on the measurement result.

* * * * *